US009548233B2

(12) United States Patent
Golda et al.

(10) Patent No.: US 9,548,233 B2
(45) Date of Patent: Jan. 17, 2017

(54) MICRO DEVICE TRANSFER HEAD ARRAY

(71) Applicant: LuxVue Technology Corporation, Santa Clara, CA (US)

(72) Inventors: Dariusz Golda, Redwood City, CA (US); Andreas Bibl, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/052,767

(22) Filed: Feb. 24, 2016

(65) Prior Publication Data
US 2016/0196998 A1 Jul. 7, 2016

Related U.S. Application Data

(63) Continuation of application No. 14/681,707, filed on Apr. 8, 2015, now Pat. No. 9,288,899, which is a (Continued)

(51) Int. Cl.
*H01L 21/683* (2006.01)
*H01L 21/768* (2006.01)
(Continued)

(52) U.S. Cl.
CPC ....... *H01L 21/6833* (2013.01); *H01L 21/6835* (2013.01); *H01L 21/76898* (2013.01);
(Continued)

(58) Field of Classification Search
CPC ............. H01L 21/6833; H01L 21/6835; H01L 21/76898; H01L 23/481; H01L 2221/68368; H05K 1/03; H05K 1/0284; H05K 1/09; H05K 1/115; H05K 2201/09036; H05K 2924/00; H05K 2924/0002
See application file for complete search history.

(56) References Cited

U.S. PATENT DOCUMENTS 4,837,176 A   6/1989   Zdebel et al.
5,067,002 A   11/1991  Zdebel et al.
(Continued)

FOREIGN PATENT DOCUMENTS

JP    11-142878       5/1999
JP    2004-079745 A   3/2004
(Continued)

OTHER PUBLICATIONS

Asano, Kazutoshi, et al., "Fundamental Study of an Electrostatic Chuck for Silicon Wafer Handling" IEEE Transactions on Industry Applications, vol. 38, No. 3, May/Jun. 2002, pp. 840-845.
(Continued)

*Primary Examiner* — Kyoung Lee
(74) *Attorney, Agent, or Firm* — Blakely, Sokoloff, Taylor & Zafman LLP

(57) ABSTRACT

A micro device transfer head array and method of forming a micro device transfer array from an SOI substrate are described. In an embodiment, the micro device transfer head array includes a base substrate and a patterned silicon layer over the base substrate. The patterned silicon layer may include a silicon interconnect and an array of silicon electrodes electrically connected with the silicon interconnect. Each silicon electrode includes a mesa structure protruding above the silicon interconnect. A dielectric layer covers a top surface of each mesa structure.

20 Claims, 17 Drawing Sheets

Related U.S. Application Data continuation of application No. 13/481,615, filed on May 25, 2012, now Pat. No. 9,034,754.

(51) Int. Cl.
*H01L 23/48* (2006.01)
*H05K 1/02* (2006.01)
*H05K 1/03* (2006.01)
*H05K 1/09* (2006.01)
*H05K 1/11* (2006.01)

(52) U.S. Cl.
CPC ......... *H01L 23/481* (2013.01); *H05K 1/0284* (2013.01); *H05K 1/03* (2013.01); *H05K 1/09* (2013.01); *H05K 1/115* (2013.01); *H01L 2221/68368* (2013.01); *H01L 2924/00* (2013.01); *H01L 2924/0002* (2013.01); *H05K 2201/09036* (2013.01)

(56) References Cited

U.S. PATENT DOCUMENTS

| | | |
|---|---|---|
| 5,110,752 A | 5/1992 | Lu |
| 5,266,514 A | 11/1993 | Tuan et al. |
| 5,426,558 A | 6/1995 | Sherman |
| 5,592,358 A | 1/1997 | Shamouilian et al. |
| 5,640,133 A | 6/1997 | MacDonald et al. |
| 5,745,331 A | 4/1998 | Shamouilian et al. |
| 5,839,187 A | 11/1998 | Sato et al. |
| 5,851,664 A | 12/1998 | Bennett et al. |
| 5,888,847 A | 3/1999 | Rostoker et al. |
| 5,903,428 A | 5/1999 | Grimard et al. |
| 5,996,218 A | 12/1999 | Shamouilian et al. |
| 6,071,795 A | 6/2000 | Cheung et al. |
| 6,096,368 A | 8/2000 | Sun |
| 6,335,263 B1 | 1/2002 | Cheung et al. |
| 6,379,929 B1 | 4/2002 | Burns et al. |
| 6,403,985 B1 | 6/2002 | Fan et al. |
| 6,420,242 B1 | 7/2002 | Cheung et al. |
| 6,521,511 B1 | 2/2003 | Inoue et al. |
| 6,558,109 B2 | 5/2003 | Gibbel |
| 6,613,610 B2 | 9/2003 | Iwafuchi et al. |
| 6,629,553 B2 | 10/2003 | Odashima et al. |
| 6,670,038 B2 | 12/2003 | Sun et al. |
| 6,786,390 B2 | 9/2004 | Yang et al. |
| 6,825,105 B2 | 11/2004 | Grover et al. |
| 6,878,607 B2 | 4/2005 | Inoue et al. |
| 7,033,842 B2 | 4/2006 | Haji et al. |
| 7,148,127 B2 | 12/2006 | Oohata et al. |
| 7,208,337 B2 | 4/2007 | Eisert et al. |
| 7,335,527 B2 | 2/2008 | Sawyer et al. |
| 7,353,596 B2 | 4/2008 | Shida et al. |
| 7,358,158 B2 | 4/2008 | Aihara et al. |
| 7,585,703 B2 | 9/2009 | Matsumura et al. |
| 7,622,367 B1 | 11/2009 | Nuzzo et al. |
| 7,723,764 B2 | 5/2010 | Oohata et al. |
| 7,785,481 B2 | 8/2010 | Wang |
| 7,795,629 B2 | 9/2010 | Watanabe et al. |
| 7,797,820 B2 | 9/2010 | Shida et al. |
| 7,829,366 B2 | 11/2010 | Miller et al. |
| 7,838,410 B2 | 11/2010 | Hirao et al. |
| 7,880,184 B2 | 2/2011 | Iwafuchi et al. |
| 7,884,543 B2 | 2/2011 | Doi |
| 7,888,690 B2 | 2/2011 | Iwafuchi et al. |
| 7,906,787 B2 | 3/2011 | Kang |
| 7,910,945 B2 | 3/2011 | Donofrio et al. |
| 7,927,976 B2 | 4/2011 | Menard |
| 7,928,465 B2 | 4/2011 | Lee et al. |
| 7,929,195 B2 | 4/2011 | Bifano |
| 7,943,497 B2 | 5/2011 | Nakai |
| 7,972,875 B2 | 7/2011 | Rogers et al. |
| 7,982,296 B2 | 7/2011 | Nuzzo et al. |
| 7,999,454 B2 | 8/2011 | Winters et al. |
| 8,023,248 B2 | 9/2011 | Yonekura et al. |
| 8,333,860 B1 | 12/2012 | Bibl et al. |
| 8,383,506 B1 | 2/2013 | Golda et al. |
| 8,415,767 B1 | 4/2013 | Golda et al. |
| 8,415,768 B1 | 4/2013 | Golda et al. |
| 8,415,771 B1 | 4/2013 | Golda et al. |
| 8,440,546 B2 | 5/2013 | Nuzzo et al. |
| 8,506,867 B2 | 8/2013 | Menard |
| 8,569,115 B1 | 10/2013 | Golda et al. |
| 8,664,699 B2 | 3/2014 | Nuzzo et al. |
| 8,686,542 B2 | 4/2014 | Golda et al. |
| 8,716,767 B2 | 5/2014 | Golda et al. |
| 8,791,530 B2 | 7/2014 | Bibl et al. |
| 8,865,489 B2 | 10/2014 | Rogers et al. |
| 8,877,648 B2 | 11/2014 | Bower et al. |
| 8,889,485 B2 | 11/2014 | Bower |
| 8,934,259 B2 | 1/2015 | Bower et al. |
| 2001/0029088 A1 | 10/2001 | Odajima et al. |
| 2002/0022308 A1 | 2/2002 | Ahn et al. |
| 2002/0076848 A1 | 6/2002 | Spooner et al. |
| 2002/0168671 A1 | 11/2002 | Burns et al. |
| 2002/0172969 A1 | 11/2002 | Burns et al. |
| 2003/0022474 A1 | 1/2003 | Grover et al. |
| 2003/0177633 A1 | 9/2003 | Haji et al. |
| 2004/0056307 A1 | 3/2004 | Cho et al. |
| 2004/0124490 A1 | 7/2004 | Bohr et al. |
| 2004/0161943 A1 | 8/2004 | Ren et al. |
| 2005/0232728 A1 | 10/2005 | Rice et al. |
| 2007/0166851 A1 | 7/2007 | Tran et al. |
| 2008/0023841 A1 | 1/2008 | Nakasato et al. |
| 2008/0048520 A1 | 2/2008 | Gulvin et al. |
| 2008/0163481 A1 | 7/2008 | Shida et al. |
| 2008/0280069 A1 | 11/2008 | Parce et al. |
| 2009/0068774 A1 | 3/2009 | Slater et al. |
| 2009/0090693 A1 | 4/2009 | Wang |
| 2009/0218642 A1 | 9/2009 | Miller et al. |
| 2009/0314991 A1 | 12/2009 | Cho et al. |
| 2010/0039747 A1* | 2/2010 | Sansoni ............ H01L 21/6833 361/234 |
| 2010/0046134 A1 | 2/2010 | Mizuno et al. |
| 2010/0142114 A1 | 6/2010 | Purohit et al. |
| 2010/0149720 A1 | 6/2010 | Fujisawa et al. |
| 2010/0188794 A1 | 7/2010 | Park et al. |
| 2010/0248484 A1 | 9/2010 | Bower et al. |
| 2011/0003410 A1 | 1/2011 | Tsay et al. |
| 2011/0121462 A1 | 5/2011 | Kim |
| 2012/0064642 A1 | 3/2012 | Huang et al. |
| 2012/0134065 A1 | 5/2012 | Furuya et al. |
| 2013/0126891 A1 | 5/2013 | Bibl et al. |
| 2013/0285086 A1 | 10/2013 | Hu et al. |
| 2013/0300812 A1 | 11/2013 | Bibl et al. |
| 2013/0316529 A1 | 11/2013 | Golda et al. |
| 2014/0373898 A1 | 12/2014 | Rogers et al. |

FOREIGN PATENT DOCUMENTS

| | | |
|---|---|---|
| JP | 2006-0148602 | 6/2006 |
| KR | 10-2002-0022557 A | 3/2002 |
| KR | 10-2004-0030610 A | 4/2004 |
| KR | 10-0800825 B1 | 1/2008 |
| KR | 10-2011-0075451 A | 7/2011 |
| WO | WO 2011/072372 | 6/2011 |
| WO | WO 2011/123285 | 10/2011 |

OTHER PUBLICATIONS

Bower, C.A., et al., "Active-Matrix OLED Display Backplanes Using Transfer-Printed Microscale Integrated Circuits", IEEE, 2010 Electronic Components and Technology Conference, pp. 1339-1343.

"Characteristics of electrostatic Chuck(ESC)" Advanced Materials Research Group, New Technology Research Laborotory, 2000, pp. 51-53 accessed at http://www.socnb.com/report/ptech_e/2000p51_e.pdf.

Guerre, Roland, et al, "Selective Transfer Technology for Microdevice Distribution" Journal of Microelectromechanical Systems, vol. 17, No. 1, Feb. 2008, pp. 157-165.

Han, Min-Koo, "AM backplane for AMOLED" Proc. Of ASID '06, Oct. 8-12, New Delhi, pp. 53-58.

(56) References Cited

OTHER PUBLICATIONS

Harris, Jonathan H., "Sintered Aluminum Nitride Ceramics for High-Power Electronic Applications" Journal of the Minerals, Metals and Materials Society, vol. 50, No. 6, Jun. 1998, p. 56.
Horwitz, Chris M., "Electrostatic Chucks: Frequently Asked Questions" Electrogrip, 2006, 10 pgs, accessed at www.electrogrip.com.
Hossick-Schott, Joachim, "Prospects for the ultimate energy density of oxide-based capacitor anodes" Proceedings of Carts Europe, Barcelona, Spain, 2007, 10 pgs.
Lee, San Youl, et al., "Wafer-level fabrication of GAN-based vertical light-emitting diodes using a multi-functional bonding material system" Semicond. Sci. Technol. 24, 2009, 4 pgs.
"Major Research Thrust: Epitaxial Layer Transfer by Laser Lift-off" Purdue University, Heterogeneous Integration Research Group, accessed at https://engineering.purdue.edu/HetInt/project_epitaxial_layer_transfer_llo.htm, last updated Aug. 2003.
Mei, Zequn, et al., "Low_Temperature Solders" Hewlett-Packard Journal, Article 10, Aug. 1996, pp. 1-10.
Mercado, Lei, L., et al., "A Mechanical Approach to Overcome RF MEMS Switch Stiction Problem" 2003 Electronic Components and Technology Conference, pp. 377-384.
Miskys, Claudio R., et al., "Freestanding GaN-substrates and devices" phys. Stat. sol. © 0, No. 6, 2003, pp. 1627-1650.
"Principles of Electrostatic Chucks: 1—Techniques for High Performance Grip and Release" ElectroGrip, Principles1 rev3 May 2006, 2 pgs, accessed at www.electrogrip.com.
Steigerwald, Daniel, et al., "III-V Nitride Semiconductors for High-Perfromance Blue and Green Light-Emitting Devices" article appears in journal JOM 49 (9) 1997, pp. 18-23. Article accessed Nov. 2, 2011 at http://www.tms.org/pubs/journals/jom/9709/setigerwald-9709.html, 12 pgs.
Widas, Robert, "Electrostatic Substrate Clamping for Next Generation Semiconductor Devices" Apr. 21, 1999, 4 pgs.
PCT International Preliminary Report on Patentability for International Application No. PCT/US2013/041444, mailed Dec. 4, 2014, 5 pages.
PCT International Search Report and Written Opinion for International Application No. PCT/US2013/041444, mailed Aug. 12, 2013, 8 pages.
LuxVue Technology Corporation Notice of Allowance for U.S. Appl. No. 13/481,592 mailed Dec. 7, 2012.
LuxVue Technology Corporation Office Action for U.S. Appl. No. 13/481,592 mailed Aug. 15, 2012.
LuxVue Technology Corporation Notice of Allowance for U.S. Appl. No. 13/543,675 mailed Jan. 8, 2013.
LuxVue Technology Corporation Office Action for U.S. Appl. No. 13/543,675 mailed Sep. 24, 2012.
LuxVue Technology Corporation Notice of Allowance for U.S. Appl. No. 13/543,680 mailed Sep. 16, 2013.
LuxVue Technology Corporation Notice of Allowance for U.S. Appl. No. 14/063,963 mailed Jan. 2, 2014.
LuxVue Technology Corporation Office Action for U.S. Appl. No. 14/221,071 mailed Aug. 20, 2014.
LuxVue Technology Corporation Notice of Allowance for U.S. Appl. No. 13/543,684 mailed Jan. 11, 2013.
LuxVue Technology Corporation Office Action for U.S. Appl. No. 13/543,684 mailed Sep. 24, 2012.
LuxVue Technology Corporation Notice of Allowance for U.S. Appl. No. 13/543,690 mailed Oct. 22, 2012.
LuxVue Technology Corporation Notice of Allowance for U.S. Appl. No. 13/828,117 mailed Nov. 7, 2013.
LuxVue Technology Corporation Office Action for U.S. Appl. No. 13/828,117 mailed Sep. 11, 2013.
LuxVue Technology Corporation Notice of Allowance for U.S. Appl. No. 14/173,693 mailed Nov. 28, 2014.
LuxVue Technology Corporation Office Action for U.S. Appl. No. 14/173,693 mailed Aug. 11, 2014.
LuxVue Technology Corporation Notice of Allowance for U.S. Appl. No. 13/481,615 mailed Jan. 20, 2015.
LuxVue Technology Corporation Office Action for U.S. Appl. No. 13/481,615 mailed Aug. 20, 2014.
LuxVue Technology Corporation Notice of Allowance for U.S. Appl. No. 14/221,071 mailed Feb. 9, 2015.
LuxVue Technology Corporation Office Action for U.S. Appl. No. 14/694,808 mailed May 20, 2015.
LuxVue Technology Corporation Office Action for U.S. Appl. No. 13/710,438 mailed Jun. 16, 2015.
LuxVue Technology Corporation Office Action for U.S. Appl. No. 13/710,442 mailed Feb. 9, 2015.
LuxVue Technology Corporation Notice of Allowance for U.S. Appl. No. 13/710,438 mailed Oct. 1, 2015.
PCT International Preliminary Report on Patentability for International Application No. PCT/US2013/041441, mailed Dec. 4, 2014, 6 pages.
PCT International Search Report and Written Opinion for International Application No. PCT/US2013/041441, mailed Aug. 12, 2013, 9 pages.
PCT International Preliminary Report on Patentability for International Application No. PCT/US2013/048364, mailed Jan. 15, 2015, 6 pages.
PCT International Search Report and Written Opinion for International Application No. PCT/US2013/048364, mailed Oct. 10, 2013, 9 pages.
PCT International Preliminary Report on Patentability for International Application No. PCT/US2013/048365, mailed Jan. 15, 2015, 6 pages.
PCT International Search Report and Written Opinion for International Application No. PCT/US2013/048365, mailed Oct. 24, 2013, 7 pages.
LuxVue Technology Corporation Notice of Allowance for U.S. Appl. No. 14/681,707 mailed Nov. 4, 2015.
LuxVue Technology Corporation Office Action for U.S. Appl. No. 14/681,707 mailed Jun. 15, 2015.
LuxVue Technology Corporation Office Action for U.S. Appl. No. 14/694,808 mailed Aug. 28, 2015.

* cited by examiner

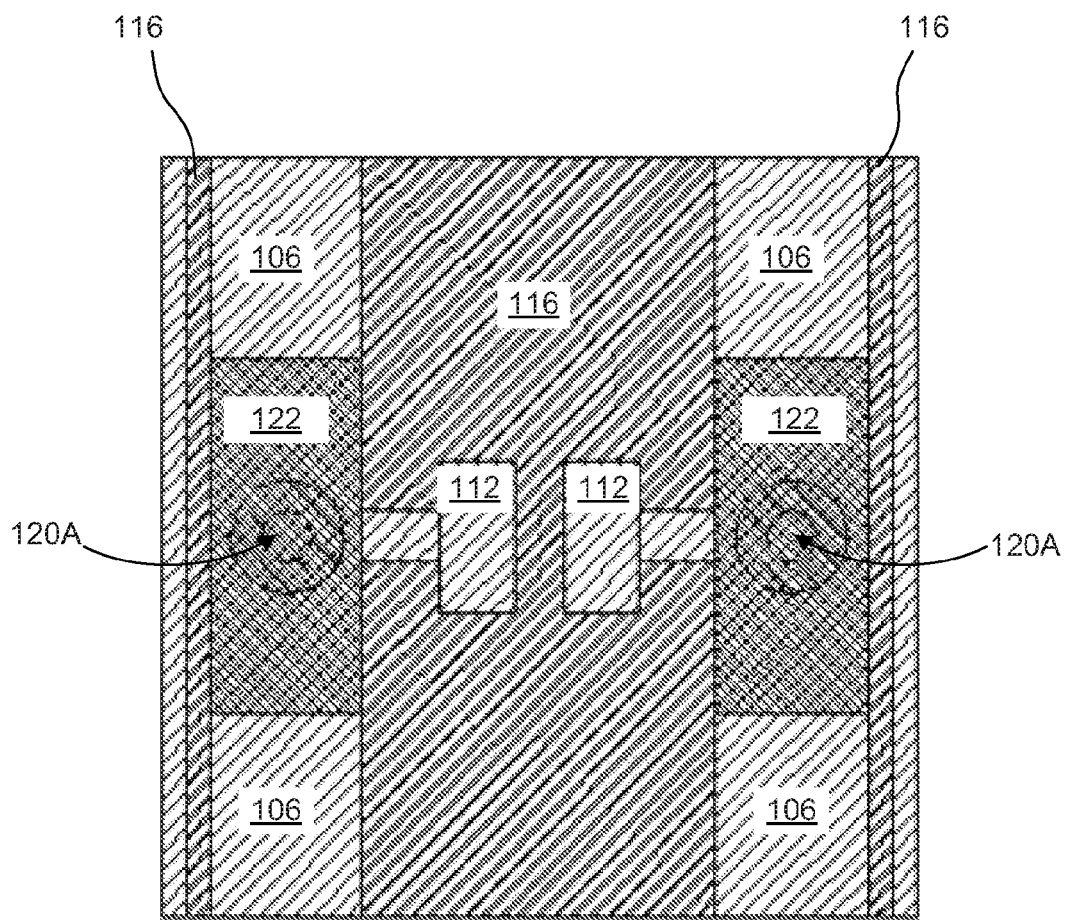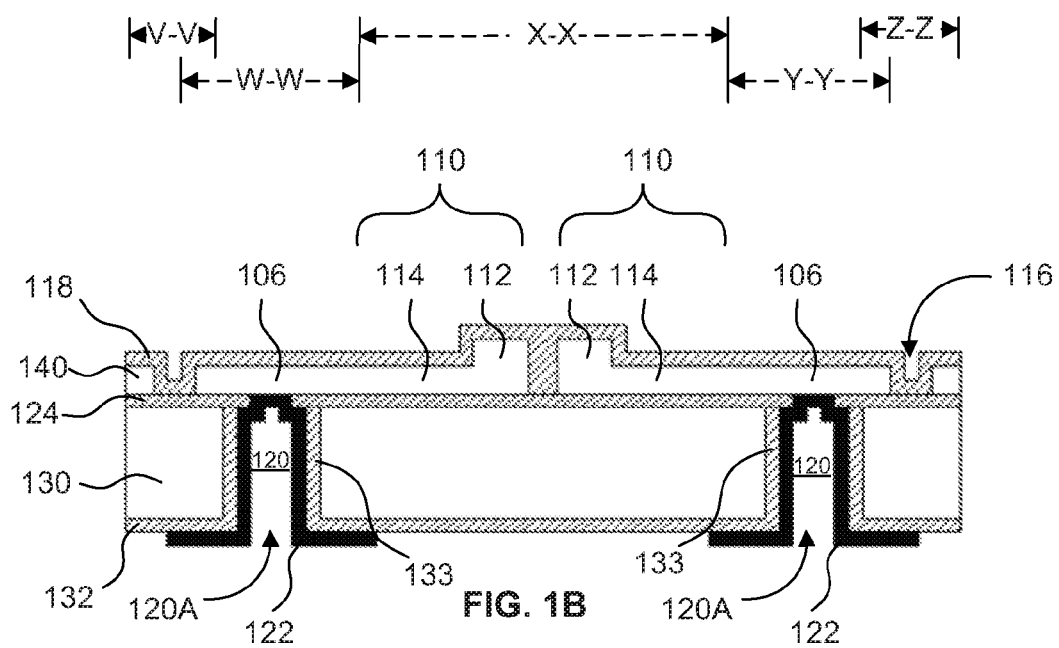
FIG. 1B

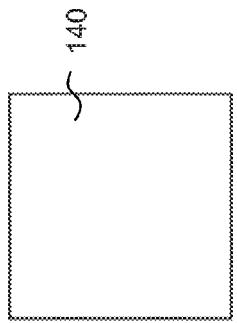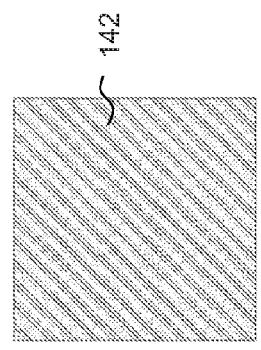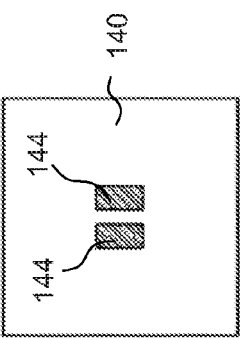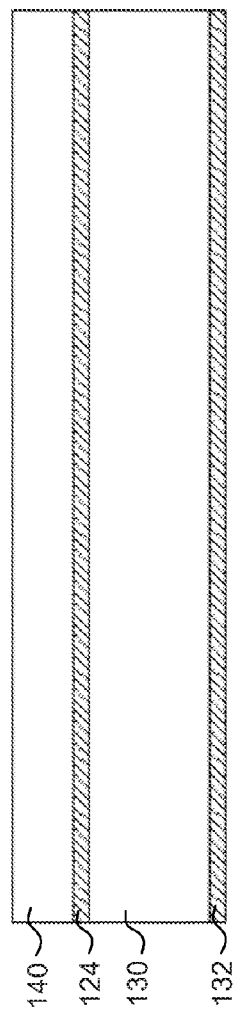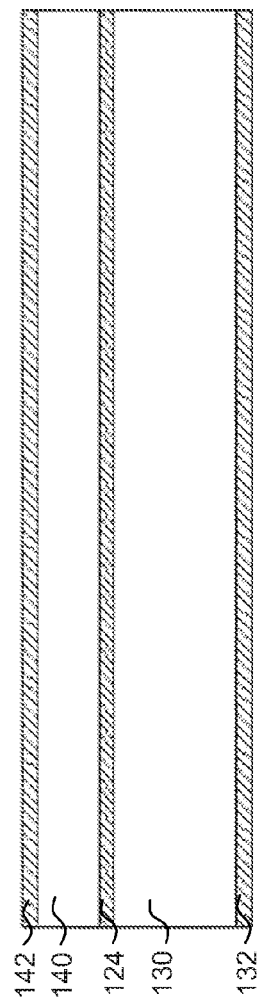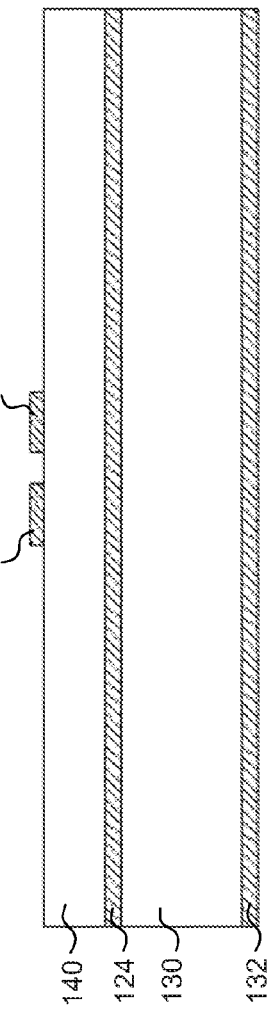

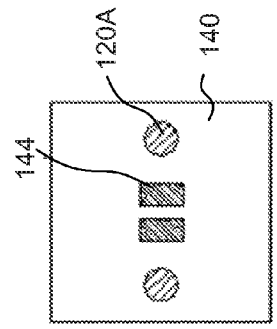
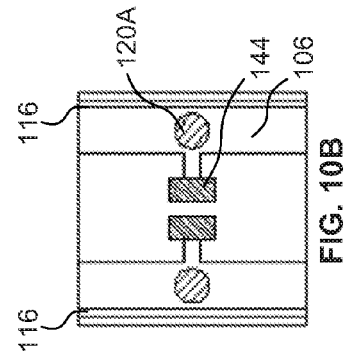
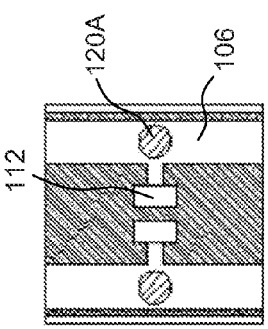
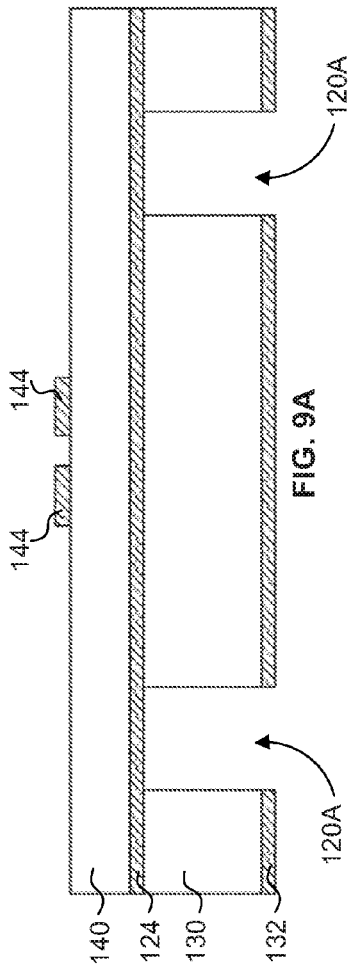
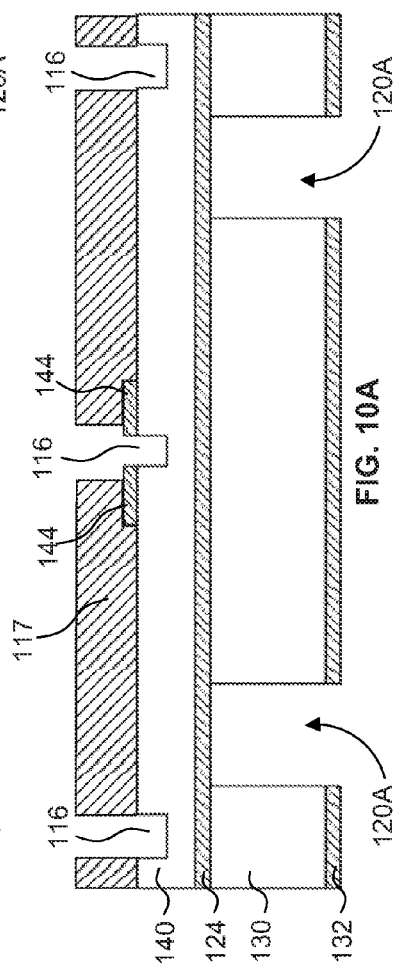
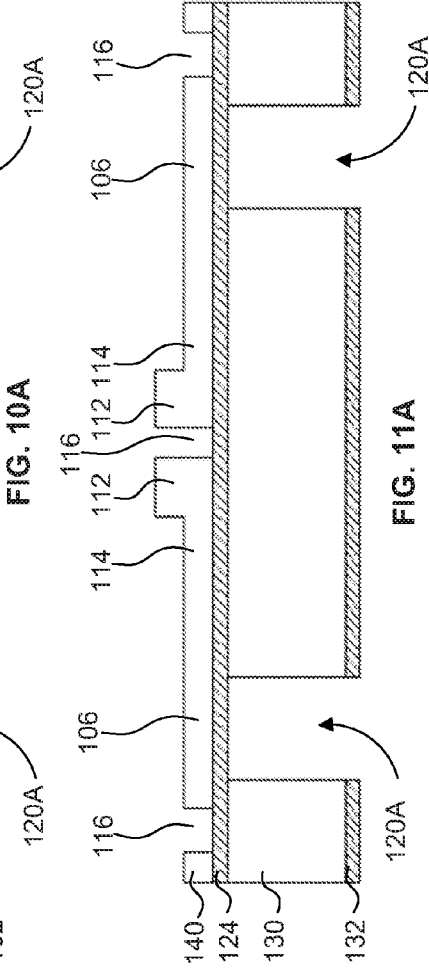

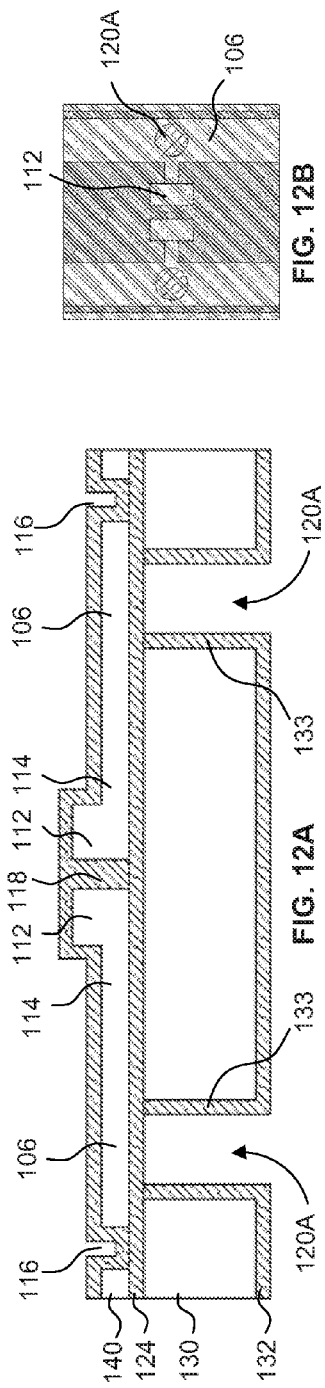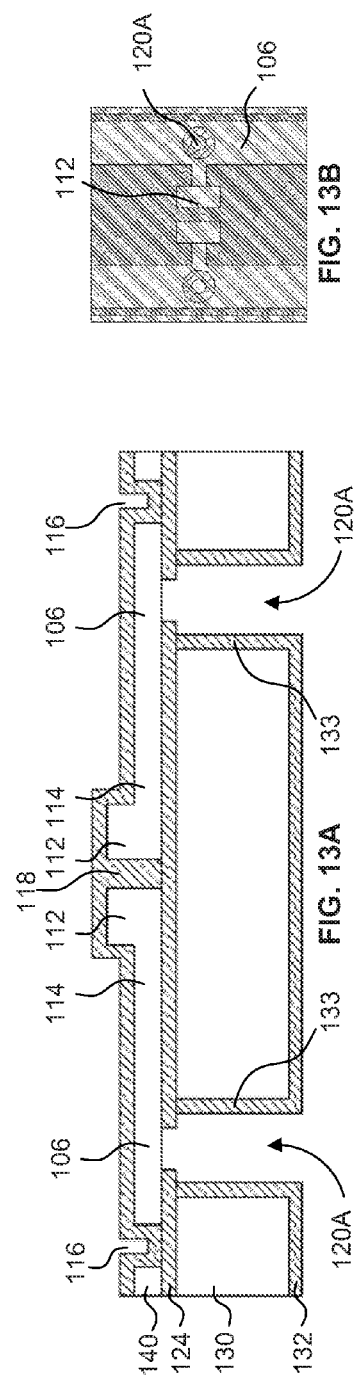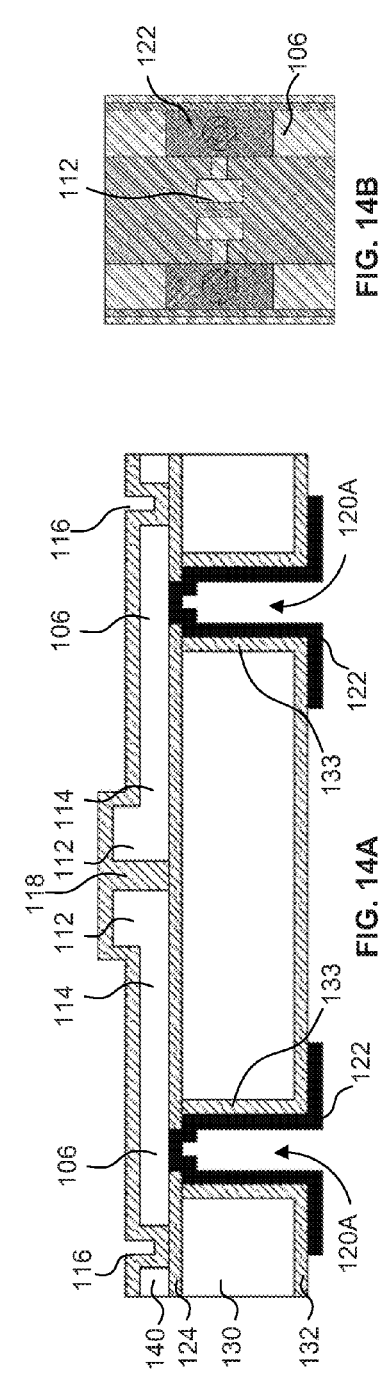

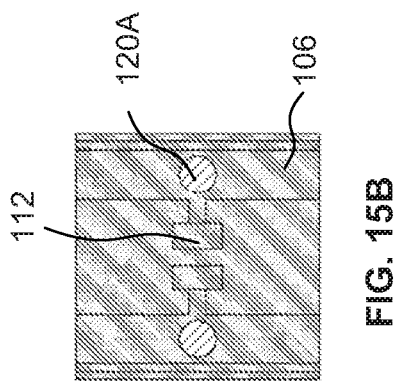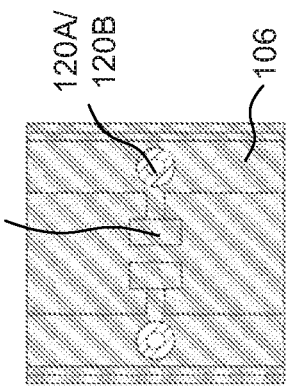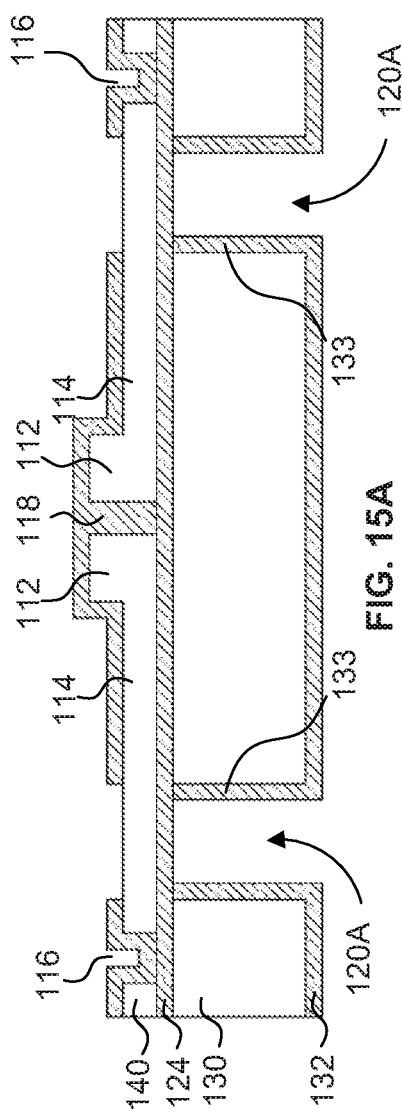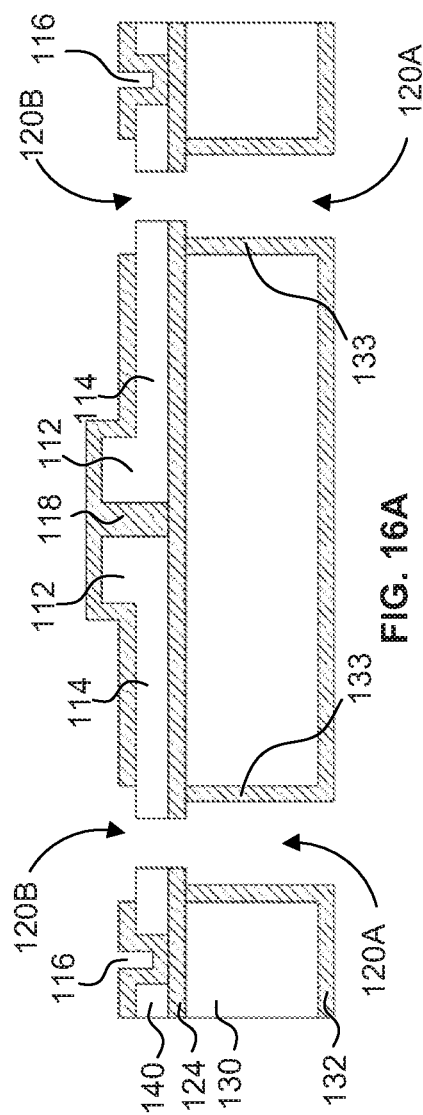

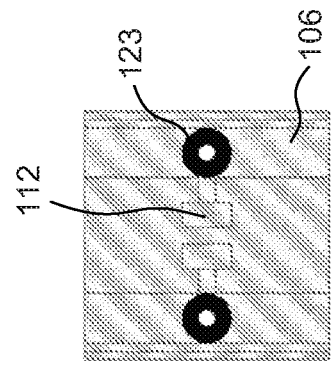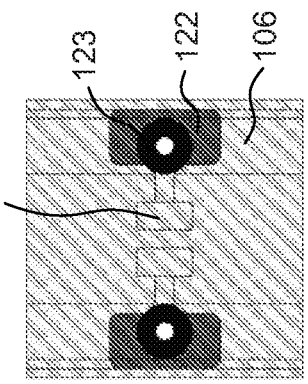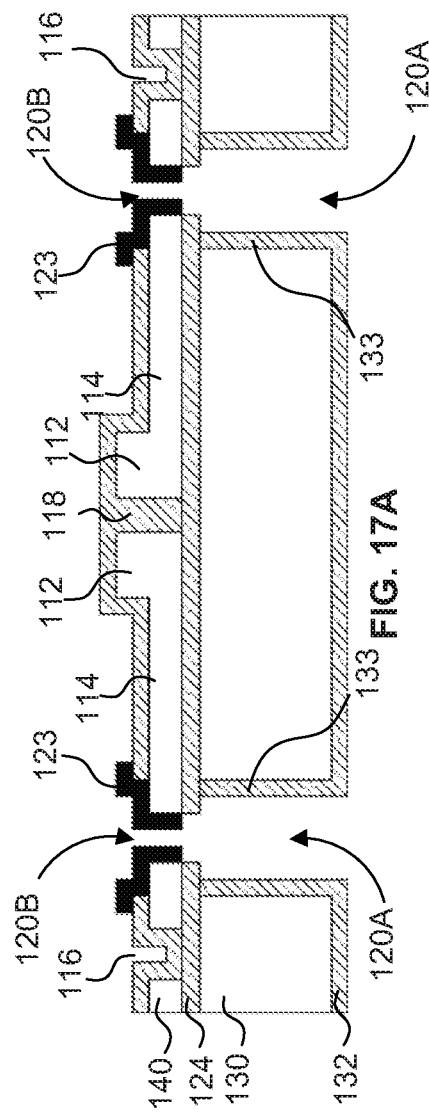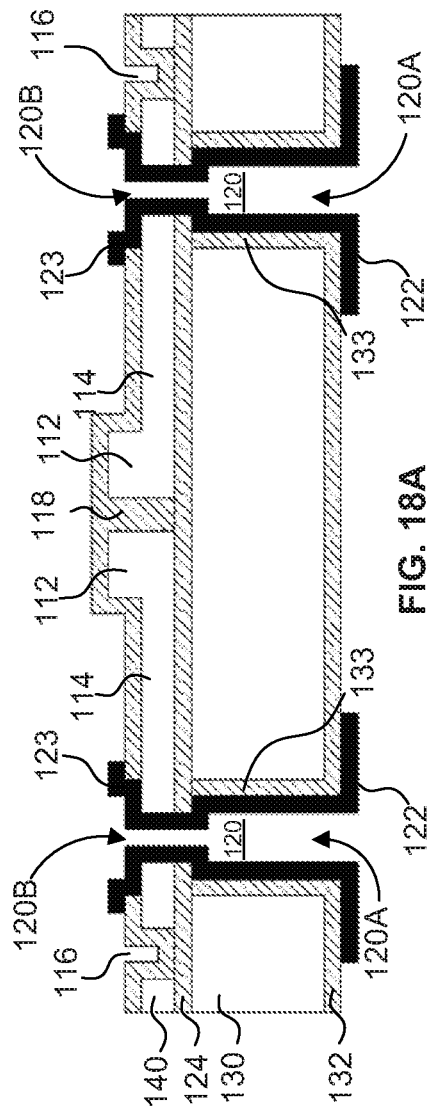

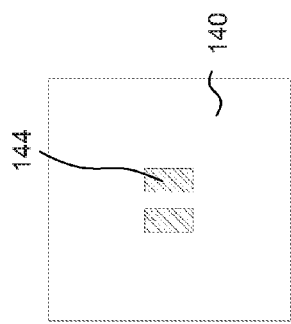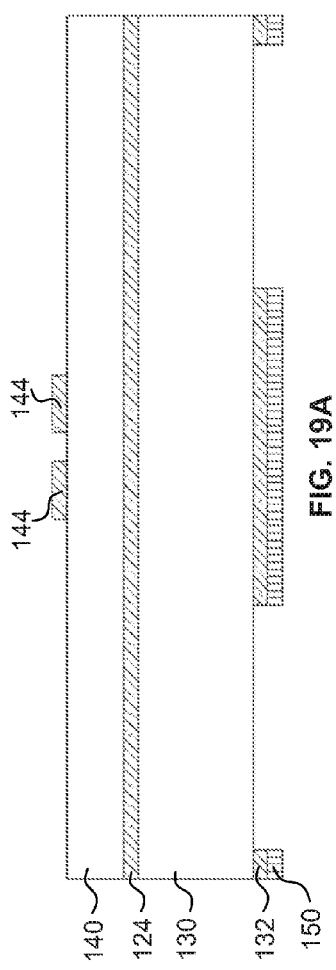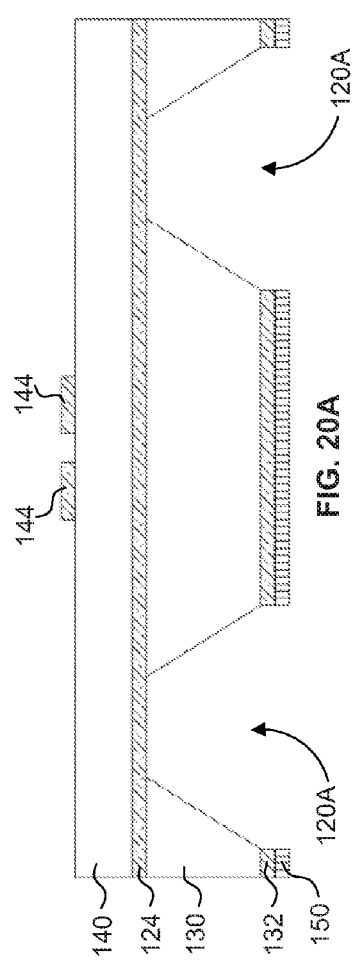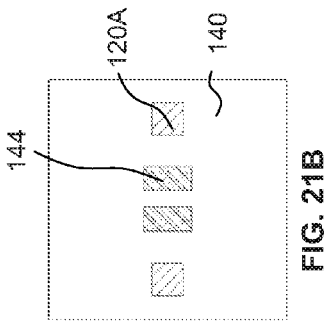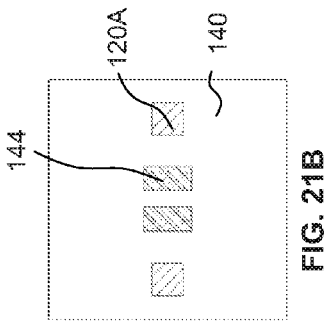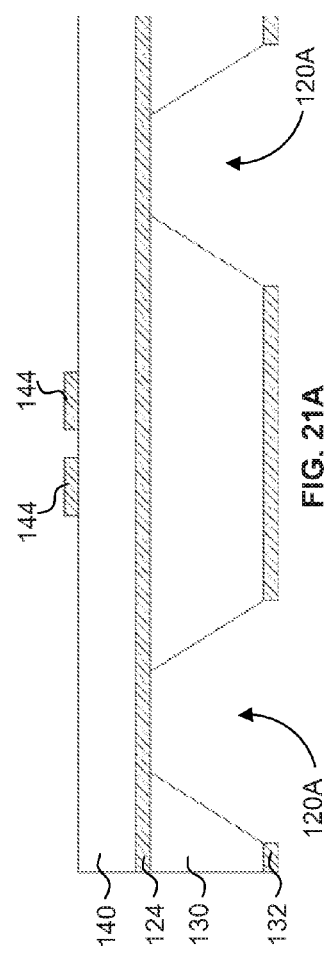

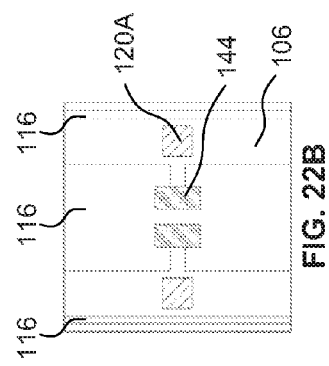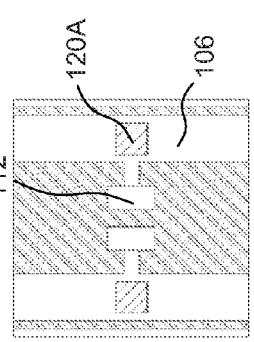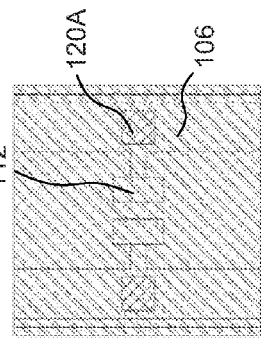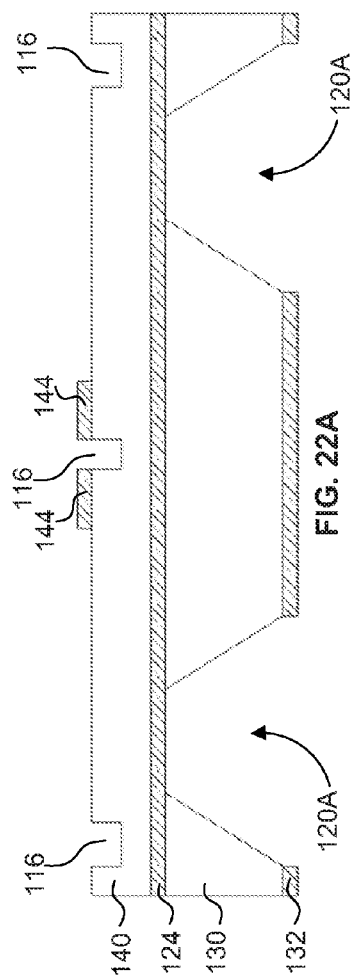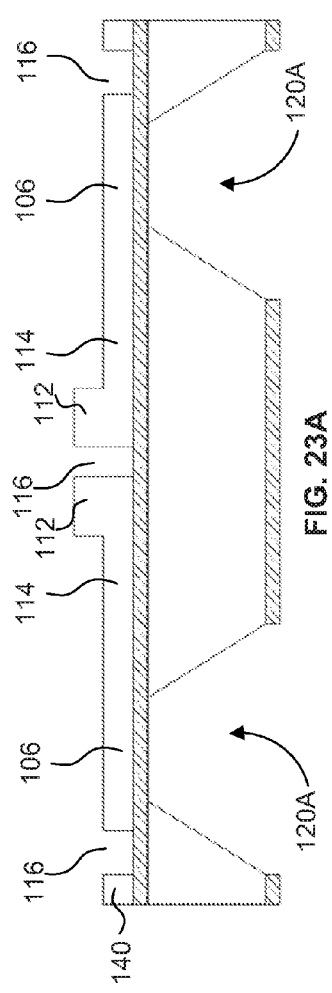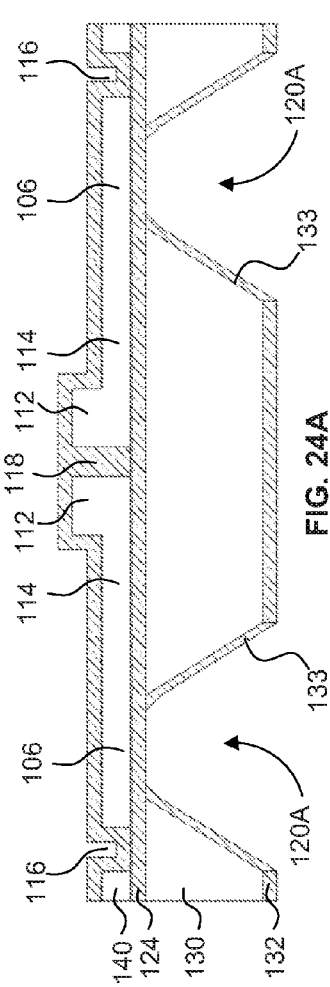

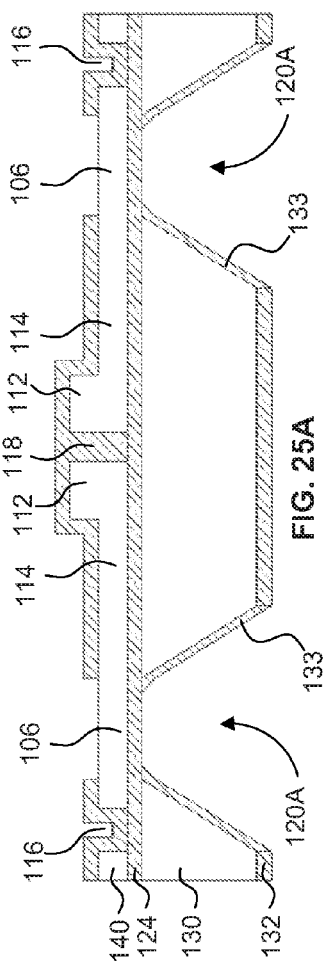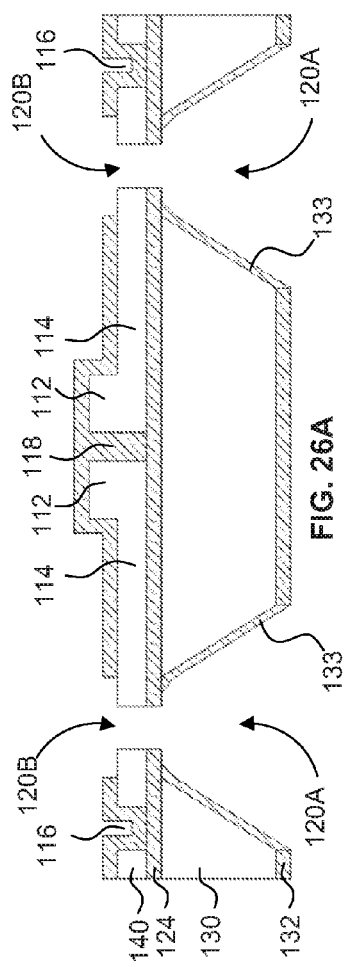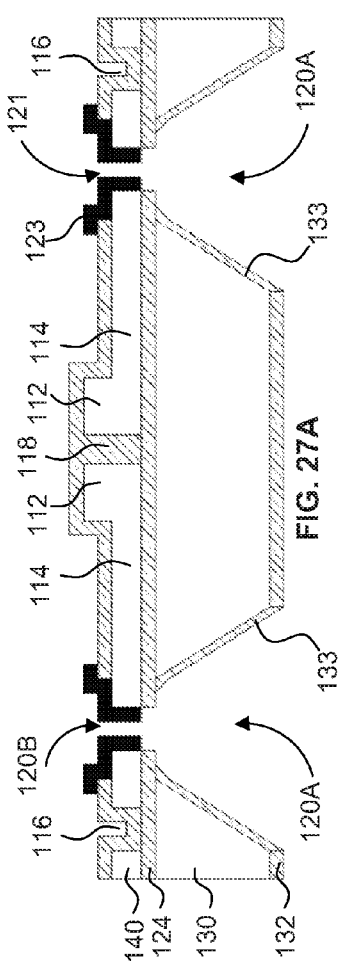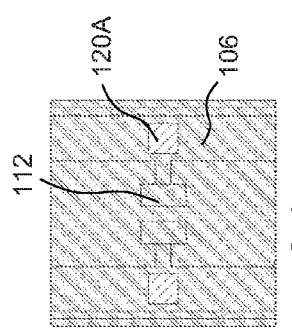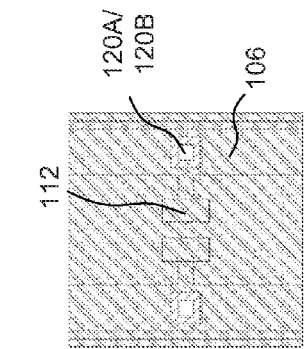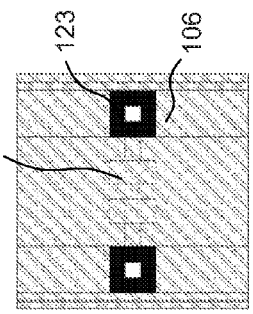

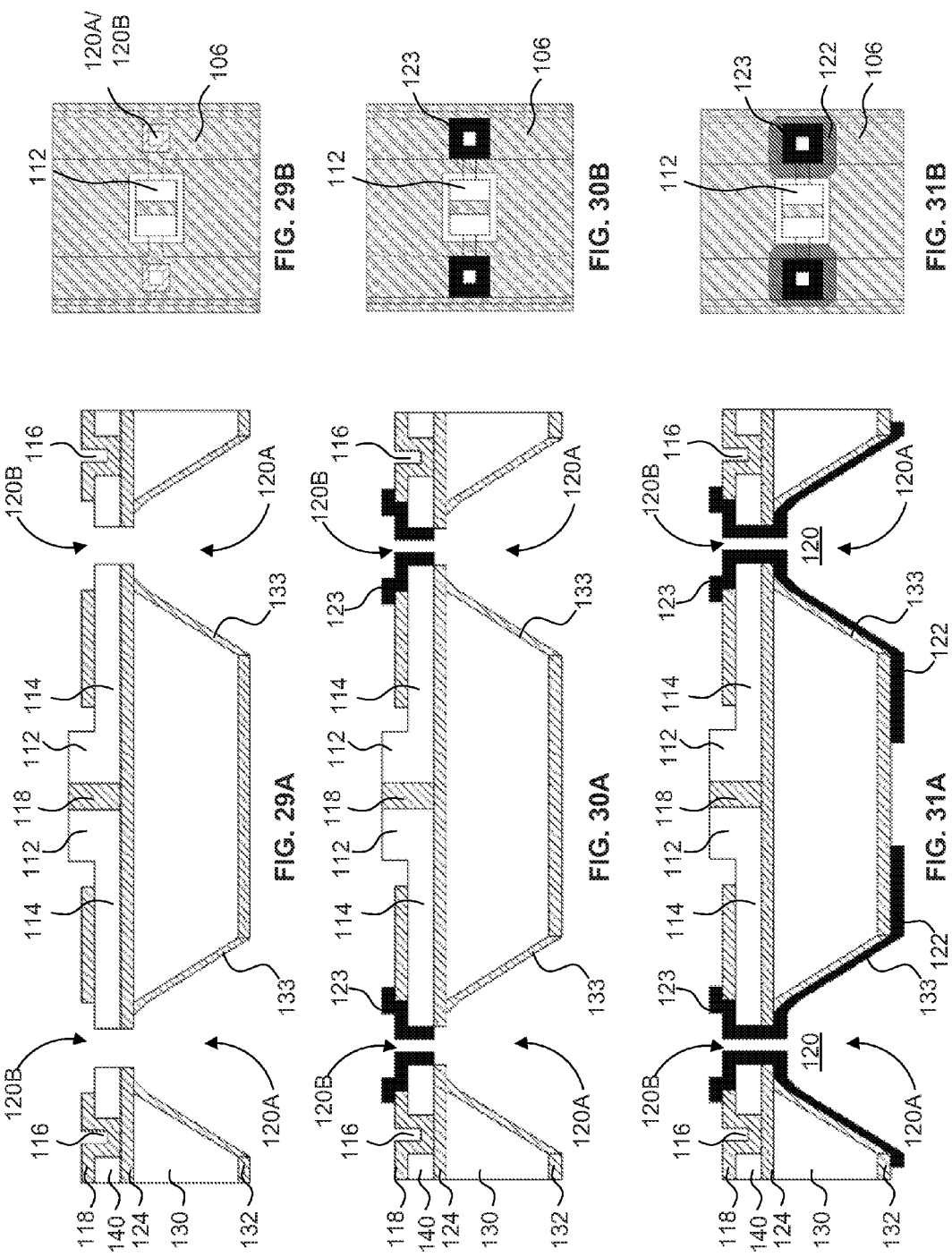

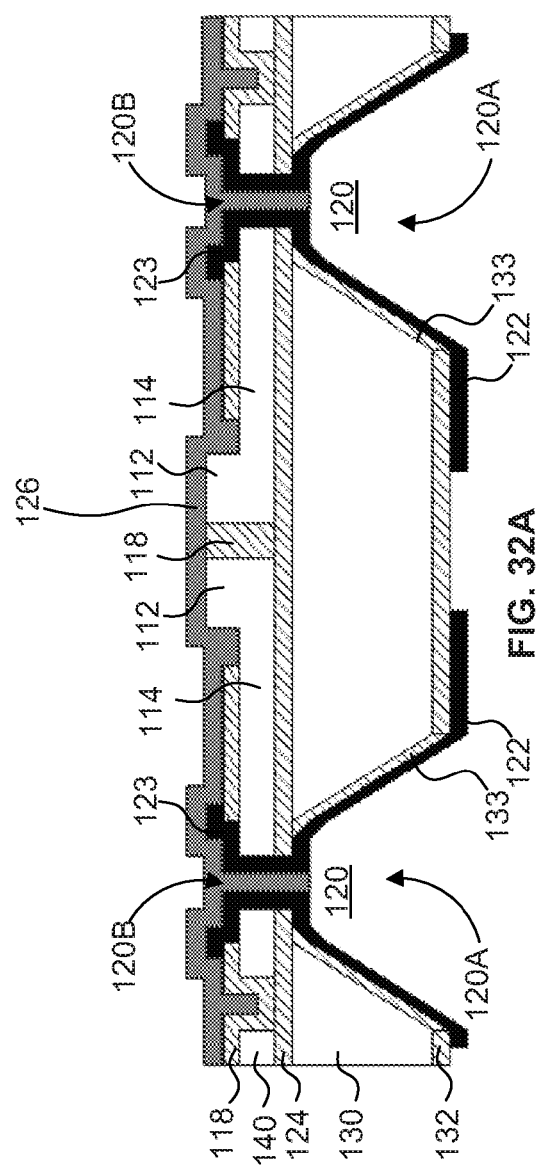
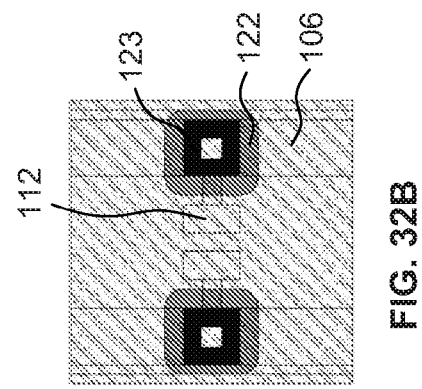
FIG. 32A
FIG. 32B

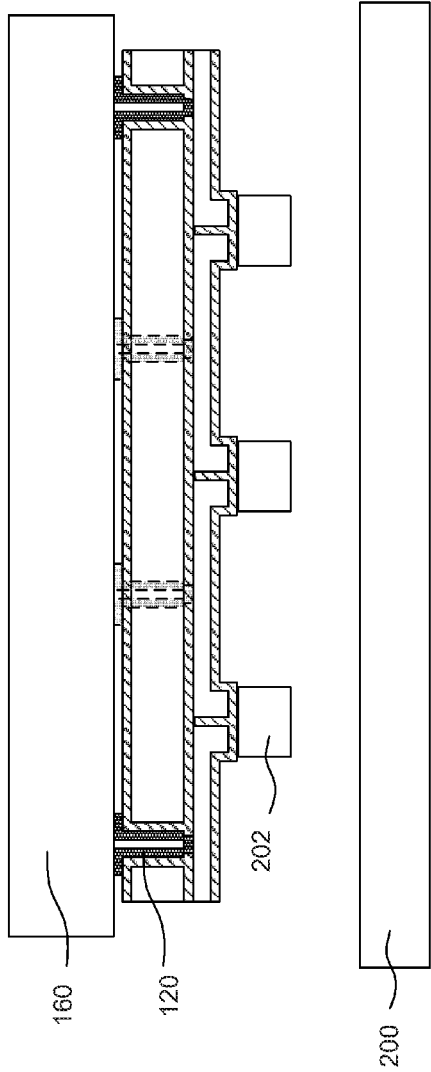
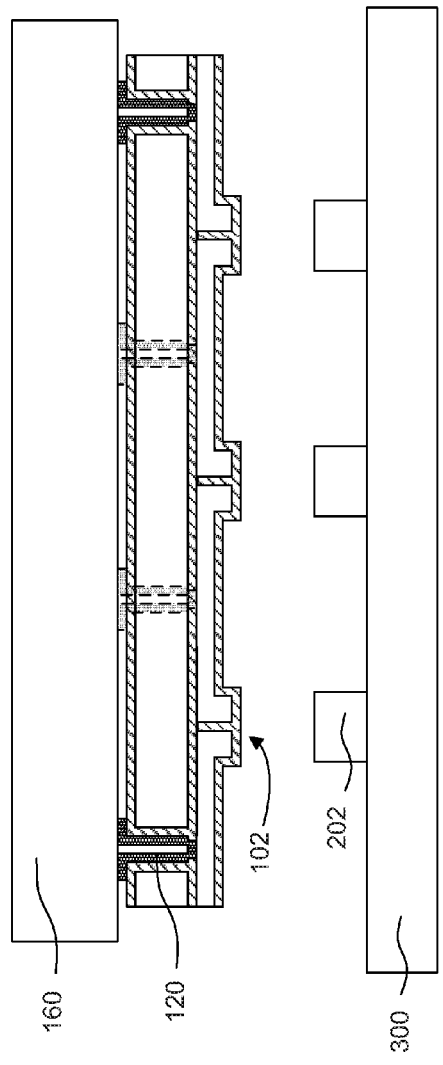

MICRO DEVICE TRANSFER HEAD ARRAY

RELATED APPLICATIONS

This application is a continuation of U.S. patent application Ser. No. 14/681,707, filed Apr. 8, 2015, which is a continuation of U.S. patent application Ser. No. 13/481,615 filed May 25, 2012, now U.S. Pat. No. 9,034,754, the full disclosure of which is incorporated herein by reference.

BACKGROUND

Field

The present invention relates to micro devices. More particularly embodiments of the present invention relate to a micro device transfer head and a method of transferring one or more micro devices to a receiving substrate.

Background Information

Integration and packaging issues are one of the main obstacles for the commercialization of micro devices such as radio frequency (RF) microelectromechanical systems (MEMS) microswitches, light-emitting diode (LED) display systems, and MEMS or quartz-based oscillators.

Traditional technologies for transferring of devices include transfer by wafer bonding from a transfer wafer to a receiving wafer. One such implementation is "direct printing" involving one bonding step of an array of devices from a transfer wafer to a receiving wafer, followed by removal of the transfer wafer. Another such implementation is "transfer printing" involving two bonding/de-bonding steps. In transfer printing a transfer wafer may pick up an array of devices from a donor wafer, and then bond the array of devices to a receiving wafer, followed by removal of the transfer wafer.

Some printing process variations have been developed where a device can be selectively bonded and de-bonded during the transfer process. In both traditional and variations of the direct printing and transfer printing technologies, the transfer wafer is de-bonded from a device after bonding the device to the receiving wafer. In addition, the entire transfer wafer with the array of devices is involved in the transfer process.

SUMMARY OF THE INVENTION

A micro device transfer head and head array, and a method of transferring one or more micro devices to a receiving substrate are disclosed. For example, the receiving substrate may be, but is not limited to, a display substrate, a lighting substrate, a substrate with functional devices such as transistors or integrated circuits (ICs), or a substrate with metal redistribution lines.

In an embodiment, a micro device transfer head array includes a base substrate and a patterned silicon layer over the base substrate. The patterned silicon layer includes a silicon interconnect and an array of silicon electrodes electrically connected with the silicon interconnect. Each silicon electrode includes a mesa structure that protrudes above the silicon interconnect. A dielectric layer such as silicon oxide, hafnium oxide, aluminum oxide, or tantalum oxide, covers a top surface of each mesa structure. Each silicon electrode may optionally include an electrode lead.

The patterned silicon layer may be the top silicon layer in a silicon-on-insulator (SOI) substrate including the top silicon layer, a buried oxide layer, and base silicon substrate. In an embodiment, the base silicon substrate is a (100) bulk silicon substrate. The top silicon layer may be doped, for example, with a n-dopant such as phosphorus.

In an embodiment a via extends through the base substrate from a backside of the base substrate to the patterned silicon layer, and the via is in electrical connection with the silicon interconnect and the array of silicon electrodes. In an embodiment, the via extends through the buried oxide layer between the patterned silicon layer and the base substrate. The via may have straight or tapered sidewalls. A passivation layer may cover a side surface of the via within the base substrate. The via may terminate at a bottom surface of the patterned silicon layer or extend through the patterned silicon layer. Where the via terminates at a bottom surface of the patterned silicon layer a conductive layer may be formed on the passivation layer in the via, and in electrical contact with the bottom surface of the patterned silicon layer. Where the via extends through the patterned silicon layer, a conductive layer may be formed on the passivation layer in the via, and in electrical contact with an interior side surface of the patterned silicon layer. The conductive layer may also partially cover a top surface of the patterned silicon layer. The portion of the conductive layer partially covering a top surface of the patterned silicon layer may have a different thickness than the portion of the conductive layer on the passivation layer. Whether the via terminates at a bottom surface of the patterned silicon layer or extends through the patterned silicon layer, the conductive layer may not completely fill the via. In an embodiment, the dielectric layer is partially formed within the via.

In an embodiment, the micro device transfer head array includes a base silicon substrate, a patterned silicon layer over the base silicon substrate, and a buried silicon oxide layer between the patterned silicon layer and the base silicon substrate. The patterned silicon layer includes a silicon interconnect and an array of silicon electrodes electrically connected with the silicon interconnect. Each silicon electrode includes a mesa structure that protrudes above the silicon interconnect. A via extends through the base silicon substrate and the buried silicon oxide layer from a backside of the base silicon substrate to the patterned silicon layer, and in electrical connection with the silicon interconnect and the array of silicon electrodes. As silicon oxide passivation layer covers a side surface of the via within the base silicon substrate. The via may terminate at a bottom surface of the patterned silicon layer or extend through the patterned silicon layer. A dielectric layer such as silicon oxide, hafnium oxide, aluminum oxide, or tantalum oxide, covers a top surface of each mesa structure.

In an embodiment, the micro device transfer head array includes first and second vias extending through the base substrate from the backside of the base substrate to the patterned silicon layer. The first via is in electrical connection with a first silicon interconnect and a first array of silicon electrodes, and the second via is in electrical connection with a second silicon interconnect and a second array of silicon electrodes. The first and second arrays of silicon electrodes may be aligned to form an array of bipolar silicon electrodes. The first and second vias may terminate at a bottom surface of the patterned silicon layer or extend through the patterned silicon layer. In an embodiment, a first dielectric layer is located on the patterned silicon layer, and is removed from over the mesa structures, and the dielectric layer covering the top surface of each mesa structure has a higher dielectric constant or dielectric breakdown strength than the first dielectric layer.

In an embodiment, a method of forming a micro device transfer head array includes etching a top silicon layer of a SOI stack to form a silicon interconnect and a plurality of silicon electrodes electrically connected with the silicon interconnect, with each silicon electrode including a mesa structure that protrudes above the silicon interconnect. A dielectric layer is then formed over the plurality of silicon electrodes through deposition, or thermal oxidation of the patterned silicon layer. Etching the top silicon layer may include first forming a mask layer on the top silicon layer, and patterning the mask layer to form a plurality of islands. The mask layer can be formed by deposition, or thermal oxidation of the top silicon layer. The plurality of islands can then be used as an etching mask to etch a plurality of trenches partially through the top silicon layer. The plurality of islands are then removed and a blanket etching can be performed on the top silicon layer to complete formation of the silicon interconnect and the plurality of silicon electrodes, with etching stopping on the buried oxide layer.

In an embodiment, a portion of the dielectric layer is removed from over the plurality of mesa structures, and a second dielectric layer is deposited over the plurality of mesa structure. In an embodiment, the second dielectric layer has a higher dielectric constant or breakdown voltage than the dielectric layer. The second dielectric layer can be deposited using a technique such as atomic layer deposition.

In an embodiment, a mask layer is formed on an SOI stack that includes the top silicon layer over a buried oxide layer, a base substrate under the buried oxide layer, and a bottom passivation layer under the base substrate. A via opening is etched through the bottom passivation layer, the base substrate, and the buried oxide layer, and a patterned conductive layer is then formed within the via opening to make electrical contact with the silicon interconnect and the plurality of silicon electrodes. For example, the patterned conductive layer can be formed by depositing through a shadow mask.

The via opening through the bas substrate may have straight sidewalls when formed using dry reactive ion etching (DRIE) or tapered sidewalls when formed using potassium hydroxide (KOH) solution. Etching of the via opening may include forming a smaller opening within the buried oxide layer than in the base substrate. Side surfaces of the via opening within the base substrate can be thermally oxidized to form a passivation layer covering the side surface of the via opening prior to forming the patterned conductive layer within the opening. For example, thermally oxidizing the side surfaces of the via opening can be performed simultaneously with thermally oxidizing the plurality of silicon electrodes to form the dielectric layer over the plurality of silicon electrodes.

In an embodiment, a mask layer is formed on an SOI stack that includes the top silicon layer over a buried oxide layer, a base substrate under the buried oxide layer, and a bottom passivation layer under the base substrate. A backside via opening is etched through the bottom passivation layer and the base substrate stopping on the buried oxide layer. A topside via opening is etched through the dielectric layer, the silicon layer, and the buried oxide layer so that the topside via opening connects with the backside via opening. A patterned conductive layer can then be deposited within the topside via opening over an exposed top surface of the silicon interconnect and within an interior side surface of the silicon interconnect. A second patterned conductive layer can then be deposited within the backside via opening and in electrical contact with the patterned conductive layer. Deposition of the patterned conductive layers can be accomplished with deposition through shadow masks.

BRIEF DESCRIPTION OF THE DRAWINGS

FIG. 1B includes a combination plan view and combination cross-section side view illustration taken along lines V-V, W-W, X-X, Y-Y, and Z-Z from FIG. 1A in accordance with an embodiment of the invention.

FIGS. 6A-14B illustrate a method of forming a bipolar micro device transfer head including backside via openings in accordance with an embodiment of the invention.

FIGS. 15A-18B illustrate a method of forming a bipolar micro device transfer head including topside and backside via openings in accordance with an embodiment of the invention.

FIGS. 19A-28B illustrate a method of forming a bipolar micro device transfer head including backside via openings with tapered sidewalls in accordance with an embodiment of the invention.

FIGS. 29A-32B illustrate a method of forming a bipolar micro device transfer head including a replacement electrode dielectric in accordance with an embodiment of the invention.

FIG. 36 is a cross-sectional side view illustration of an array of transfer heads picking up an array of micro devices in accordance with an embodiment of the invention.

FIG. 37 is a cross-sectional side view illustration of an array of micro devices released onto a receiving substrate in accordance with an embodiment of the invention.

DETAILED DESCRIPTION OF THE INVENTION

Figure 1A:
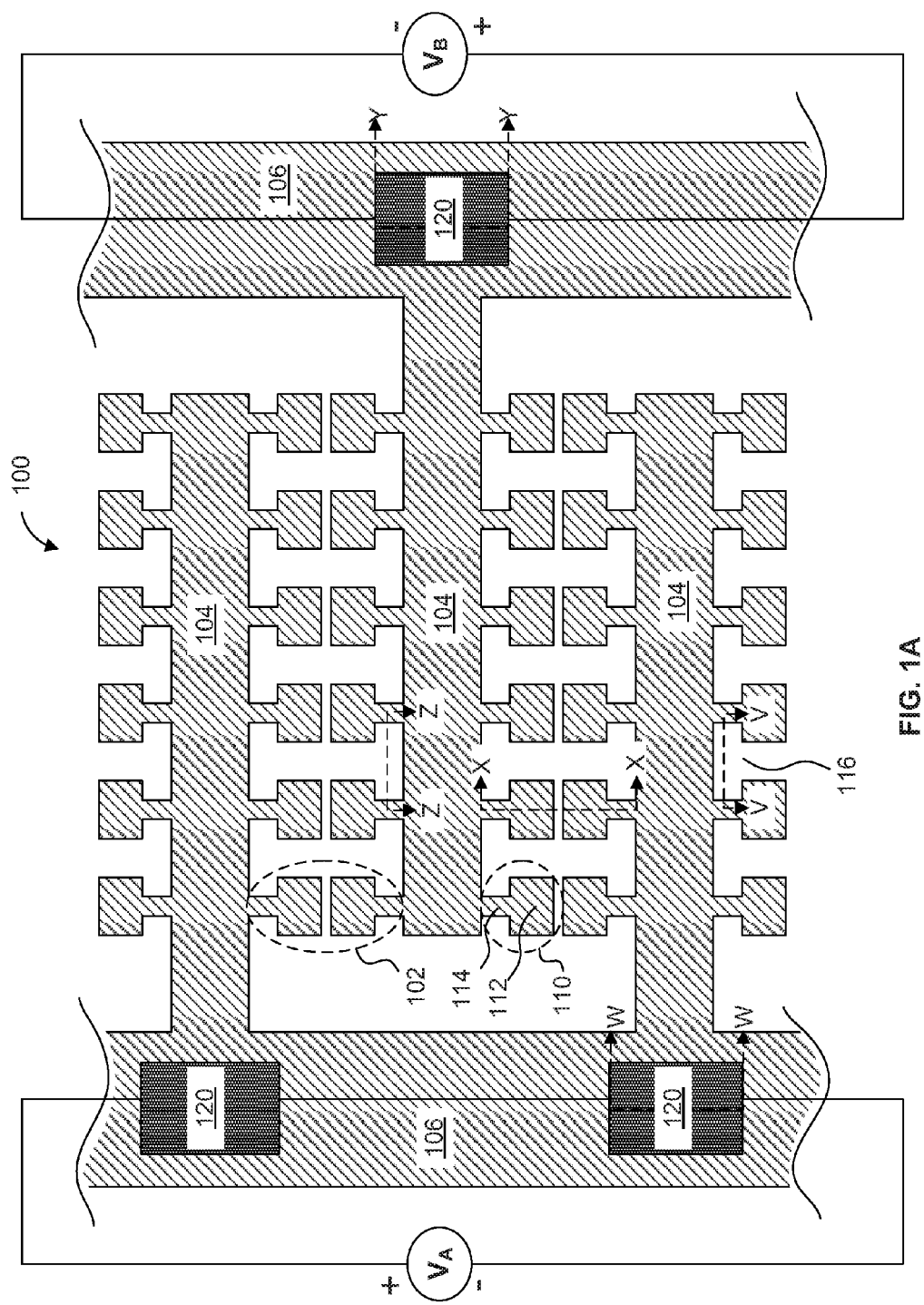
FIG. 1A is a plan view illustration of a bipolar micro device transfer head in accordance with an embodiment of the invention.

Embodiments of the present invention describe a micro device transfer head and head array, and method of transferring a micro device and an array of micro devices to a receiving substrate. For example, the micro device transfer head and head array may be used to transfer micro devices such as, but not limited to, diodes, LEDs, transistors, ICs, and MEMS from a carrier substrate to a receiving substrate such as, but not limited to, a display substrate, a lighting substrate, a substrate with functional devices such as transistors or integrated circuits (ICs), or a substrate with metal redistribution lines.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment," "an embodiment" or the like means that a particular feature, structure, configuration, or characteristic described in connection with the embodiment is included in at least one embodiment of the invention. Thus, the appearances of the phrase "in one embodiment," "an embodiment" or the like in various places throughout this specification are not necessarily referring to the same embodiment of the invention. Furthermore, the particular features, structures, configurations, or characteristics may be combined in any suitable manner in one or more embodiments.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The terms "micro" device or "micro" LED structure as used herein may refer to the descriptive size of certain devices or structures in accordance with embodiments of the invention. As used herein, the terms "micro" devices or structures are meant to refer to the scale of 1 to 100 μm. However, it is to be appreciated that embodiments of the present invention are not necessarily so limited, and that certain aspects of the embodiments may be applicable to larger, and possibly smaller size scales.

In one aspect, without being limited to a particular theory, embodiments of the invention describe micro device transfer heads and head arrays which operate in accordance with principles of electrostatic grippers, using the attraction of opposite charges to pick up micro devices. In accordance with embodiments of the present invention, a pull-in voltage is applied to a micro device transfer head in order to generate a grip pressure on a micro device and pick up the micro device.

In another aspect, embodiments of the invention describe a manner of forming an array of micro device transfer heads from a commercially available silicon-on-insulator (SOI) substrate including a base substrate, buried oxide layer, and a top silicon device layer. In such an embodiment, a silicon interconnect and an array of electrodes are formed from the top silicon layer of the SOI substrate. Each individual transfer head includes one or more silicon electrodes. For example, the transfer heads may include monopolor or bipolar electrodes. In an embodiment, a bipolar electrostatic transfer head includes a pair of silicon electrodes, where each silicon electrode includes a mesa structure and optionally an electrode lead. The mesa structures for the pair of silicon electrodes protrude above their respective silicon interconnects to provide a localized contact point to pick up a specific micro device during a pick up operation. In this manner, it is not necessary to form patterned metal electrodes. It has been observed that when patterning of metal electrodes and electrode leads using a negative photoresist, for example, it can be difficult to control exposure of the photoresist at different depths (e.g. along both a top surface and down sidewalls of a mesa structure). Peeling of the patterned metal layers has also been observed during photoresist removal, potentially affecting operability of the transfer heads. In accordance with embodiments of the present invention, it is not required to form a patterned metal electrode over a mesa structure. Instead, the protruding profile of the mesa structure is formed by patterning the silicon electrode to include a raised portion corresponding to the mesa structure which protrudes away from the base substrate and above the silicon interconnect.

Silicon electrodes prepared in accordance with embodiments of the invention may include integrally formed mesa structures which are substantially taller compared to non-integrally formed mesa structures with patterned metal electrodes. Photolithography can limit patterned metal electrode structures to heights of 5-10 μm, whereas silicon electrode mesa structures can be up to 20-30 μm or taller. The mesa structure height for a silicon electrode structure is limited by the etch aspect ratio and the electrode gap (e.g. between a pair of bipolar silicon electrodes). In an embodiment, aspect ratios for silicon electrode mesa structures can range from 10-20:1. For example, silicon electrode mesa structures in a bipolar electrode configuration can be 20 μm tall separated by a 2 μm gap between the mesa structures. Taller electrode structures may also afford larger clearance for contaminant particles and reduce the effects of stray filed on un-targeted micro devices. When compared to metalized mesa structures, silicon electrodes with integrally formed mesa structures can be more robust to surface contamination and errors in planar alignment of the micro device transfer head in relation to the micro device carrier substrate.

In another aspect, embodiments of the invention describe a manner of forming an array of micro device transfer heads from a commercially available silicon-on-insulator (SOI) substrate which allows for a processing sequence with minimal processing steps. The processing sequence does not require metal deposition and patterning steps to form metal electrodes, which relieves thermal processing constraints and allows for the formation of dielectric and passivation layers by high temperature thermal oxidation resulting in reduced deposition and patterning operations.

In another aspect, embodiments of the invention describe a transfer head and transfer head array including vias extending through the base substrate from a backside of the base substrate to the patterned silicon layer for connecting the electrodes with working circuitry of a transfer head assembly. The processing sequence in accordance with embodiments of the invention also enables passivation of the vias extending through the base substrate with high temperature thermal oxide growth.

In yet another aspect, embodiments of the invention describe a manner for mass transfer of an array of pre-fabricated micro devices with an array of transfer heads. For example, the pre-fabricated micro devices may have a specific functionality such as, but not limited to, a LED for light-emission, silicon IC for logic and memory, and gallium arsenide (GaAs) circuits for radio frequency (RF) communications. In some embodiments, arrays of micro LED devices which are poised for pick up are described as having a 10 μm by 10 μm pitch, or 5 μm by 5 μm pitch. At these densities a 6 inch substrate, for example, can accommodate approximately 165 million micro LED devices with a 10 μm by 10 μm pitch, or approximately 660 million micro LED devices with a 5 μm by 5 μm pitch. A transfer tool including an array of transfer heads matching an integer multiple of the pitch of the corresponding array of micro LED devices can be used to pick up and transfer the array of micro LED devices to a receiving substrate. In this manner, it is possible to integrate and assemble micro LED devices into heterogeneously integrated systems, including substrates of any size ranging from micro displays to large area displays, and at high transfer rates. For example, a 1 cm by 1 cm array of micro device transfer heads can pick up and transfer more than 100,000 micro devices, with larger arrays of micro device transfer heads being capable of transferring more micro devices. Each transfer head in the array of transfer heads may also be independently controllable, which enables selective pick up and release of the micro devices.

Referring now to FIG. 1A, a plan view illustration is provided for a portion of a micro device transfer head array and includes views at different depths. In the particular embodiment illustrated, the hatch shading illustrates an arrangement of silicon electrodes and silicon interconnects as viewed from the top surface of the micro device transfer head array, and the darker shading illustrates a backside via connection as viewed from the backside surface of the micro device transfer head array. In this manner, the plan view illustration provides detail regarding structures which have been formed from both sides of the SOI wafer.

As illustrated, the micro device transfer head array 100 includes an array of transfer heads 102 connected by an arrangement of silicon trace interconnects 104, and silicon bus interconnects 106. As illustrated, silicon bus interconnects 106 may be formed around a periphery or outside a working area of the transfer head array including the array of transfer heads 102. In an embodiment, each transfer head 102 includes a pair of silicon electrodes 110, with each silicon electrode 110 including a mesa structure 112 and optionally an electrode lead 114 connected to a silicon interconnect 104.

In an embodiment, a plurality of vias 120 are formed through the backside of the base substrate to the patterned silicon layer to make contact with silicon interconnects 106 in order to electrically connect the silicon electrodes 110 with working circuitry of a transfer head assembly. In the embodiment illustrated in FIG. 1A, the silicon interconnect 106 on the left side of the illustration may be connected to a first voltage source $V_A$, and the silicon interconnect 106 on the right side of the illustration may be connected to a second voltage source $V_B$. Where each transfer head 102 is operable as a bipolar transfer head, voltage sources $V_A$ and $V_B$ may simultaneously apply opposite voltages so that each of the silicon electrodes 110 in a respective transfer head 102 has an opposite voltage.

Referring now to FIG. 1B, a combination plan view illustration and combination cross-sectional side view illustration are provided taken along lines V-V, W-W, X-X, Y-Y, and Z-Z from FIG. 1A. The combination views are not representations of the precise relative locations for all of the different features illustrated, rather the combination views combine specific features at different locations in FIG. 1A in a single illustration to more easily represent the processing sequence. For example, while the cross-sectional side view illustration shows one via 120 corresponding to one silicon electrode 110, it is clear from FIG. 1A that one via 120 may be electrically connected with a plurality of silicon electrodes 110 along one or more silicon interconnects 104. As illustrated, lines V-V and Z-Z are along one or more trenches 116 between adjacent silicon electrodes 110. Referring again to FIG. 1A, one or more trenches 116 may be formed around all silicon electrodes 110, and between silicon interconnects 104, 106. As illustrated, lines W-W and Y-Y are along backside vias 120. As illustrated, line X-X is across a bipolar transfer head including a pair of silicon electrodes 110.

Still referring to FIG. 1B, a silicon electrode 110 includes a mesa structure 112 and optionally an electrode lead 114, where the mesa structure 112 is an elevated portion of the silicon electrode 110. A dielectric layer 118 may cover a top surface of the pair of silicon electrodes 110. Dielectric layer 118 may also cover a side surface of the mesa structures 112 laterally between the pair of mesa structure 112 for the pair of silicon electrodes 110 in a bipolar transfer head 102. A via opening 120A extends through the base substrate 130 from a backside of the base substrate to the patterned silicon layer 140 where silicon interconnect 106 is located. In the particular embodiment illustrated in FIG. 1B, the via opening 120A extends through a buried oxide layer 124 and terminates at a bottom surface of the patterned silicon layer 140 where silicon interconnect 106 is located. A passivation layer 132 is formed on the backside of the base substrate 130, and a passivation layer 133 is formed on side surfaces within the via opening 120A. Where base substrate is formed of silicon, the passivation layers 132, 133 insulate electrical shorting between the vias 120. The buried oxide layer 124 also insulates electrical shorting between the silicon electrodes 110, and silicon interconnects 104, 106.

Referring now to FIGS. 2A-2B, FIGS. 3A-3B, FIGS. 4A-4B, and FIGS. 5A-5B, various different transfer head array configurations in accordance with embodiments of the invention are illustrated side-by-side. It is to be understood that while the following variations are separately illustrated and described, the variations are not necessarily incompatible with one another, and that the variations may be combined in any suitable manner in one or more embodiment.

Figure 2A:
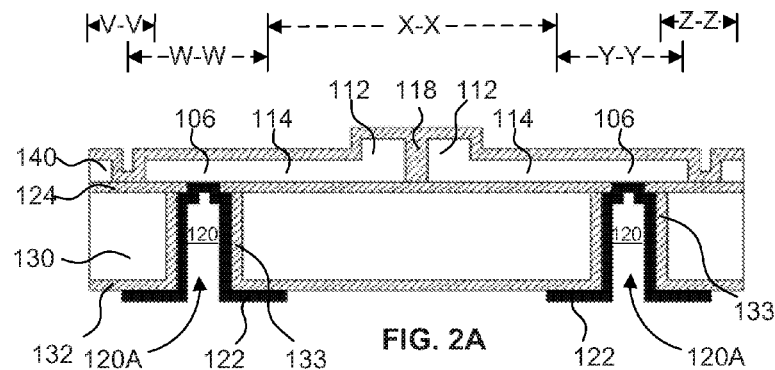
FIG. 2A is a combination cross-sectional side view illustration taken along lines V-V, W-W, X-X, Y-Y, and Z-Z from FIG. 1A in accordance with an embodiment of the invention.
Figure 2B:
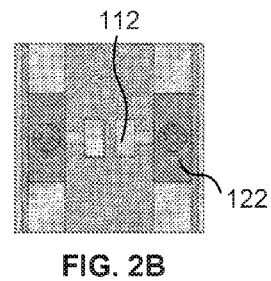
FIG. 2B is a combination plan view illustration taken along lines V-V, W-W, X-X, Y-Y, and Z-Z from FIG. 1A in accordance with an embodiment of the invention.

FIGS. 2A-2B are the combination plan view illustration and combination cross-sectional side view illustration described above with regard to FIG. 1B. FIGS. 3A-3B, FIGS. 4A-4B, and FIGS. 5A-5B are combination plan view illustrations and combination cross-sectional side view illustrations prepared similarly as those in FIG. 1B. Therefore, the combination views are not representations of the precise relative locations for all of the different features illustrated, rather combination views combine specific features at different locations previously identified in FIG. 1A in order to more easily represent the particular variations in processing sequences.

As previously described with regard to FIG. 1B, the vias 120 illustrated in FIG. 2A-2B extend through the base substrate 130 from a backside of the base substrate to a patterned silicon layer 140. In an embodiment, vias 120 contact one or more silicon bus interconnects 106 in the patterned silicon layer 140. In other embodiments, vias 120 may contact other features or silicon interconnects in the patterned silicon layer 140. Via 120 along line W-W may be electrically connected to a first silicon interconnect 106 which is connected to a first voltage source $V_A$, and via 120 along line Y-Y may be electrically connected to a second silicon interconnect 106 which is connected to a second voltage source $V_B$. In the particular embodiment illustrated, via openings 120A extend through a buried oxide layer 124 and terminate at a bottom surface of a silicon interconnect 106. A passivation layer 132 is formed on the backside of the base substrate 130 and on side surfaces within the via openings 120A. A conductive layer 122 is formed on the passivation layer 133 and is in electrical contact with the bottom surface of a silicon interconnect 106. In the particular embodiment illustrated, the conductive layers 122 do not completely fill the via openings 120A, and the conductive layers 122 are physically and electrically separated in order to prevent shorting between vias 120 connected to different voltage sources $V_A$, $V_B$. In an embodiment, vias 120 which are electrically connected to the same voltage source may or may not be physically and electrically connected. For example, a conductive layer 122 may span across both vias 120 on the left side of FIG. 1A, and also be electrically and physically separated from the via 120 taken along line Y-Y on the right side of FIG. 1A.

Figure 3A:
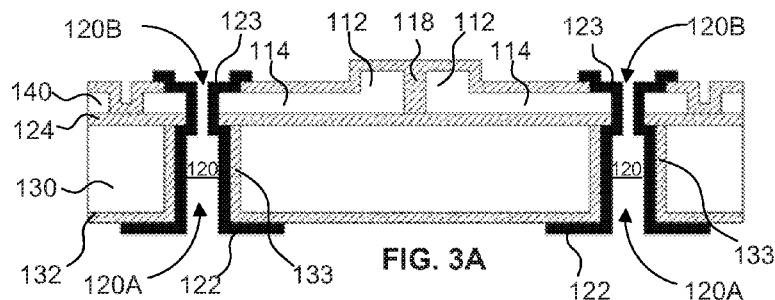
FIG. 3A is a combination cross-sectional side view illustration of a bipolar micro device transfer head including topside and backside via openings in accordance with an embodiment of the invention.
Figure 3B:
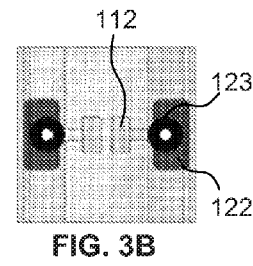
FIG. 3B is a combination top plan view of a bipolar micro device transfer head including topside and backside via openings in accordance with an embodiment of the invention.

Referring now to FIGS. 3A-3B, in one embodiment topside via opening 120B may be formed over the backside via opening 120B to form via 120. As will become more apparent in the following description, the topside via opening 120B may be formed in order make electrical contact with the silicon interconnects 106 and to form an opening through the buried oxide layer 124 without the lithographic challenges associated with not adversely affecting the passivation layer 133 along the sidewalls of via openings 120A. A conductive layer 123 can optionally be formed over the exposed top surface of the silicon interconnects 106 and within an interior side surface of the silicon interconnects 106. In this manner, partially forming conductive layer 123 over the top surface of the silicon interconnect 106 can provide greater surface area for ohmic contact with the silicon interconnects 106. Due to the closer proximity of the silicon interconnect 106 to the top surface of the SOI structure than the backside surface of the SOI structure, in accordance with some embodiments, it may be more efficient to form a layer of conductive layer 123 within the interior side surface of silicon interconnect 106 from above the top surface of the SOI structure as opposed to from the back surface of the SOI structure. Conductive layer 123 may be formed from the same or different material from conductive layer 122. Conductive layers 122, 123 may form a continuous conductive layer along the via 120 side surfaces.

Figure 4A:
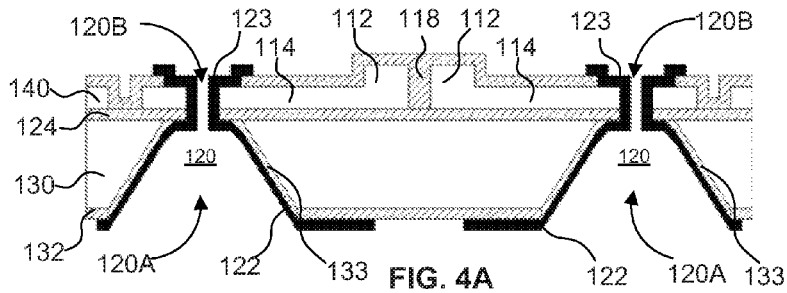
FIG. 4A is a combination cross-sectional side view illustration of a bipolar micro device transfer head including tapered backside via openings in accordance with an embodiment of the invention.
Figure 4B:
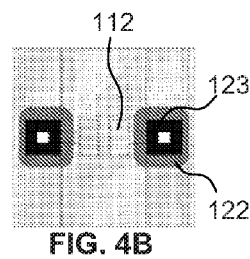
FIG. 4B is a combination top plan view of a bipolar micro device transfer head including tapered backside via openings in accordance with an embodiment of the invention.

Referring now to FIGS. 4A-4B, in one embodiment the backside via opening 120A includes tapered sidewalls in order to more efficiently form passivation layer 133 along sidewalls of the via opening 120A, and conductive layer 122 on the passivation layer 133 and on interior side surfaces of silicon interconnect 106. It is to be appreciated, that while FIGS. 4A-4B are illustrated as a variation of FIGS. 3A-3B, that the feature of tapered sidewalls in backside via opening 120A can be combined with the embodiment illustrated in FIGS. 2A-2B, and that a topside via opening 120B is not required for the formation of tapered sidewalls in backside via opening 120A. For example, the tapered sidewalls may partially alleviate the lithographic challenges associated with forming openings in the buried oxide layer 124 from the backside via openings 120A while not adversely affecting the passivation layer 133 along the sidewalls of via openings 120A.

Figure 5A:
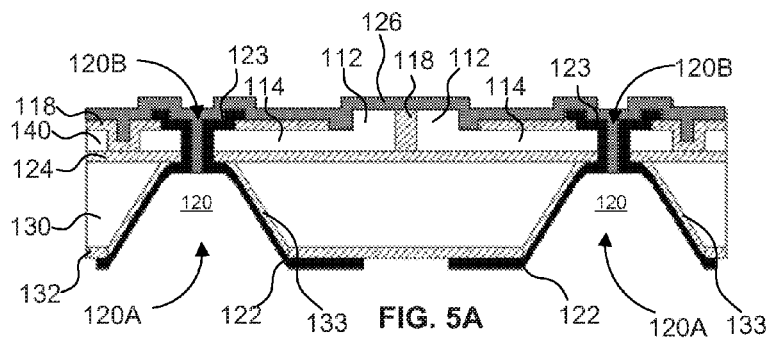
FIG. 5A is a combination cross-sectional side view illustration of a bipolar micro device transfer head including deposited dielectric layer in accordance with an embodiment of the invention.
Figure 5B:
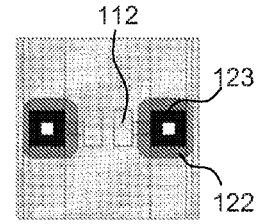
FIG. 5B is a combination top plan view of a bipolar micro device transfer head including deposited dielectric layer in accordance with an embodiment of the invention.
Figure 28B:
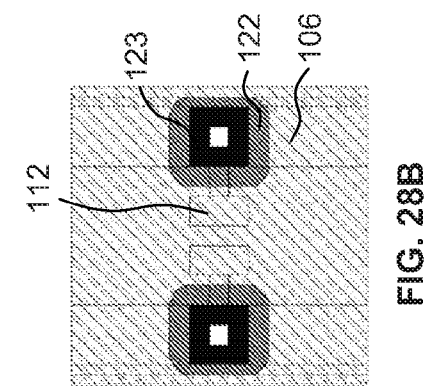
Figure 28A:
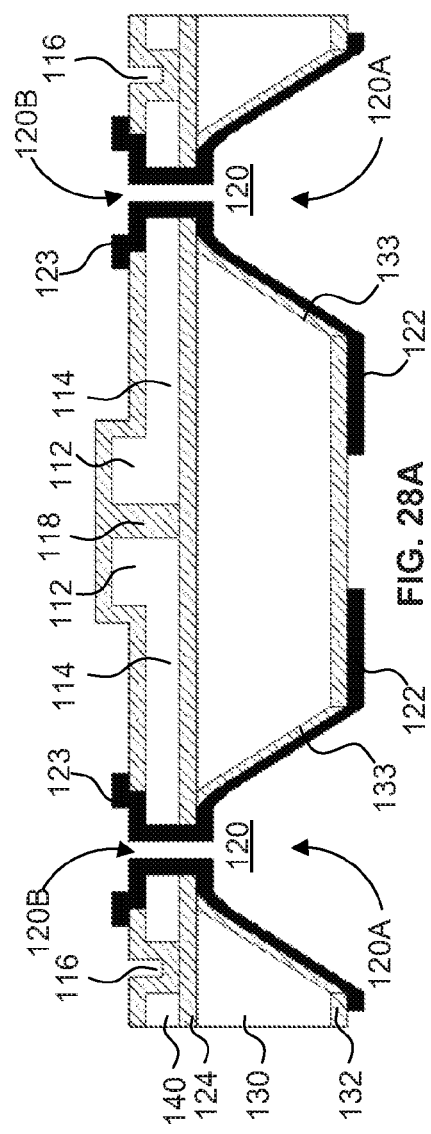

Referring now to FIGS. 5A-5B, in one embodiment, dielectric layer 118 may be partially or completely removed. In the particular embodiment illustrated in FIGS. 5A-5B, the dielectric layer 118 is removed from over the mesa structures 112. A second dielectric layer 126 is formed over the top surface of mesa structures 112 and over the remaining topography of the transfer head array, which may include portions of dielectric layer 118. Dielectric layer 126 may also cover the topside via openings 120B and corresponding conductive layers 123, and may partially or completely fill the topside via openings 120B within the silicon interconnects 106. In an embodiment, dielectric layer 126 has a higher dielectric constant and/or dielectric breakdown strength than dielectric layer 118. In an embodiment, dielectric layer 118 is thermally grown $SiO_2$, and dielectric layer 126 is atomic layer deposition (ALD) $SiO_2$, $Al_2O_3$, $Ta_2O_5$, or $RuO_2$. It is to be appreciated, that while FIGS. 5A-5B are illustrated as a variation of FIGS. 4A-4B, that the feature of a dielectric layer 126 can be combined with the embodiments illustrated in FIGS. 2A-2B and FIGS. 3A-3B, and that a topside via opening 120B or tapered sidewalls in backside via opening 120A are not required for the formation of dielectric layer 126.

FIGS. 6A-14B illustrate a method of forming a bipolar micro device transfer head including backside via openings in accordance with an embodiment of the invention. Initially, the processing sequence may begin with a commercially available SW substrate as illustrated in FIGS. 6A-6B. The SOI substrate may include base substrate 130, top silicon device layer 140, a buried oxide layer 124 between the base substrate and the top silicon device layer, and backside passivation layer 132. In an embodiment, base substrate is a (100) silicon handle wafer having a thickness of 500 μm+/−50 μm, buried oxide layer 124 is 1 μm+/−0.1 μm thick, and top silicon device layer is 7-20 μm+/−0.5 μm thick. The top silicon device layer may also be doped to improve conductivity. For example, a phosphorous dopant concentration of approximately $10^{17}$ $cm^{-3}$ yields a resistivity of less than 0.1 ohm-centimeter. In an embodiment, the backside passivation layer 132 is a thermal oxide having a thickness up to approximately 2 μm thick, which is the approximate upper limit for thermal oxidation of silicon.

A mask layer 142 may then be formed over the silicon device layer 140, as illustrated in FIGS. 7A-7B. Mask layer 142 may be deposited, or alternatively thermally grown from the silicon device layer 140. In an embodiment, mask layer 142 is a thermally growth $SiO_2$ layer having a thickness of approximately 0.1 μm. In an embodiment, where mask layer 142 is thermally growth $SiO_2$, the mask layer 142 has a thickness which is significantly less than the thickness of buried oxide ($SiO_2$) layer 124 in order to maintain structural stability for the partially patterned SOI structure during removal of the patterned mask layer.

Referring to FIGS. 8A-8B, the mask layer 142 is then patterned to form an array of islands 144 which will correspond to the mesa structures of the silicon electrodes. In an embodiment, mask layer is a thermally grown $SiO_2$ layer, and islands 144 are formed by applying a positive photoresist, exposing, and removing undeveloped areas of the photoresist with a potassium hydroxide (KOH) developer solution. The mask layer 142 is then dry etched to form islands 144 using a suitable technique such as ion milling, plasma etching, reactive ion etching (RIE), or reactive ion beam etching (RIBE), electron cyclotron resonance (ECR), or inductively coupled plasma (ICP), stopping on the silicon layer 140. If a high degree of anisotropic etching is not required, a dry plasma etching technique with a plasma etchant such as $CF_4$, $SF_6$ or $NF_3$ may be used. The patterned photoresist is then removed by $O_2$ ashing followed by piranha etch resulting in the structure illustrated in FIGS. 8A-8B.

In an embodiment, backside via openings 120A are then formed in the SOI substrate. Initially, as illustrated in FIGS. 9A-9B, the backside via openings are formed through the backside passivation layer 132 and base substrate 130, stopping on the buried oxide layer 124. In an embodiment, the backside via openings 120A illustrated in FIGS. 9A-9B are formed by applying a patterned positive photoresist on the backside passivation layer 132, followed by etching of the exposed passivation layer 133 and dry reactive ion etching (DRIE) of the base substrate 130, stopping on the buried oxide layer 124. The base substrate 130 may alternatively be etched with a wet etchant such as KOH. However, KOH wet etchant attacks silicon preferentially in the (100) plane, and may produce an anisotropic V-etch. DRIE etching may be selected for more vertical sidewalls in the backside via openings 120A. After etching of the base substrate 130, the patterned positive photoresist can be removed by $O_2$ ashing followed by piranha etch resulting in the structure illustrated in FIGS. 9A-9B.

Referring to FIGS. 10A-11B, the silicon electrodes 110 and silicon interconnects 104, 106 are patterned in a two part etching sequence. First, as illustrated in FIGS. 10A-10B the top silicon layer 140 is partially etched through, defining the patterns of the silicon electrodes and silicon interconnects 104, 106. In an embodiment, this may be accomplished with a thin patterned positive photoresist, DRIE etching approximately 5 µm of a 7-10 µm thick top silicon layer 140 in a timed etch. In accordance with embodiments of the invention, openings in the photoresist 117 (illustrated in FIG. 10A only) correspond to the size of the trenches 116 on the edges of FIG. 10A used to define the silicon electrodes 110 and silicon interconnects 104, 106, however, the openings over the islands 144 corresponding to the gap between silicon electrode mesa structures 112 may be larger than the gap between the islands 144. In this manner, the islands 144 in the patterned hard mask layer 142 can be used to form silicon electrode mesa structures 112 with higher gap resolution between mesa structures when compared to using photoresist alone. The patterned positive photoresist can be removed using $O_2$ ashing followed by piranha etch. Second, as illustrated in FIGS. 11A-11B with islands 144 still present, DRIE etching is continued using islands 144 as a mask to form the silicon electrodes 110 including the protruding mesa structures 112, and silicon interconnects 104, 106, stopping on the underlying buried oxide layer 124. Upon completion of etching the silicon layer 140, a dry etching technique is performed to remove the islands 144, approximately 0.1 µm. In an embodiment, where only 0.1 µm of oxide is removed, and the buried oxide 124 is approximately 1.0 µm thick, a significant portion of the exposed buried oxide 124 is not removed. In accordance with embodiments of the invention, the buried oxide 124 provides structural stability for the partially patterned SOI structure and a significant portion of the buried oxide 124 is not removed during removal of the islands 144. As illustrated in FIG. 11B, the buried oxide layer 124 is exposed in trenches 116 around the silicon electrodes and between the interconnects.

Referring now to FIGS. 12A-12B, the front and back sides of the SOI wafer can then be oxidized in order to passivate the silicon electrodes, silicon interconnects, and backside via opening. In an embodiment, high temperature wet oxidation may be performed in order to grow an approximately 1 µm thick oxide layer 118 on the silicon electrodes 110, between the mesa structures 112, on the silicon interconnects 104, 106, and within trenches 116. An approximately 1 µm thick oxide layer 133 is also simultaneously grown within the backside via openings 120A along sidewalls of the base substrate 130.

A dry oxide etch using a suitable dry etching technique is then performed to create openings in the buried oxide layer 124 within the backside via openings 120A to expose a bottom surface of the patterned silicon layer 140 where silicon interconnects 106 are formed, as illustrated in FIGS. 13A-13B. In an embodiment, a thin positive photoresist is formed over the backside of the SOI wafer and within the backside via opening 120A and patterned. The buried oxide layer 124 is then etched to expose a bottom surface of the silicon layer 140. As illustrated, the openings in the buried oxide layer 124 are smaller (e.g. smaller diameter or cross-section) than the openings within the base substrate 130 (including the oxide layer 133). In this manner, having a smaller opening within the buried oxide layer 124 than in the base substrate (including oxide layer 133) protects against inadvertently etching through the oxide layer 133, or undercutting the oxide layer 133 and electrically shorting the backside via 120 with the base substrate 130. Due to lithographic tolerances and resolution capabilities, the openings within the buried oxide layer 124 may have a minimum cross-section of greater than 10 µm.

Referring now to FIGS. 14A-14B, a patterned conductive layer 122 is formed on the passivation layer 133 within the via openings 120A and in electrical contact with the bottom surface of the silicon interconnect 106. In an embodiment, the patterned conductive layer 122 is formed by sputtering through a shadow mask. In an embodiment, the patterned conductive layer 122 includes a first layer of 500 angstrom thick titanium (Ti), a middle layer of 500 angstrom thick titanium-tungsten (TiW), and a 1 µm to 2 µm thick outer layer of gold (Au). In an embodiment, the patterned conductive layer 122 makes ohmic contact with the silicon interconnects 106. Following the formation of patterned conductive layer 122, the SOI substrate may then be diced, for example using laser dicing, to form a plurality of transfer heads each including an array of transfer heads 102, interconnected with silicon interconnects 104, 106 and vias 120 extending through the base substrate 130 from a backside of the base substrate to the patterned silicon layer 140 to electrically connect the silicon electrodes 110 with working circuitry of a transfer head assembly.

FIGS. 15A-18B illustrate a method of forming a bipolar micro device transfer head including topside and backside via openings in accordance with an embodiment of the invention. The processing sequence leading up to FIGS. 15A-15B may be identical to the processing sequence of FIGS. 6A-12B. In an embodiment illustrated in FIGS. 15A-15B, openings are formed in the top dielectric layer 118 directly above the backside via openings 120A. Openings may be formed in top dielectric layer 118 with a thick patterned positive photoresist, followed by dry etching of the top dielectric layer 118. The patterned photoresist is then removed by $O_2$ ashing followed by piranha etch resulting in the structure in FIGS. 15A-15B.

Referring now to FIGS. 16A-16B, openings are formed in the silicon layer 140 and buried oxide layer 124 to form a topside via opening 120B which connects with backside via opening 120A. Openings may be formed in the silicon layer 140 and buried oxide layer 124 by forming a thick patterned positive photoresist, followed by DRIE of the silicon layer 140 stopping on the buried oxide layer 124, followed by RIE through the buried oxide layer 124. The patterned photoresist is then removed by $O_2$ ashing followed by piranha etch resulting in the structure in FIGS. 16A-16B. In this manner, forming the openings through the buried oxide layer 124 when forming the topside via openings 120B may avoid the lithographic challenges associated with forming an opening in the buried oxide layer 124 from the backside of the SOI structure without adversely affecting the passivation layer 133 along the sidewalls of the via openings 120A.

A patterned conductive layer 123 may then be formed over the exposed top surface of the silicon interconnects 106 and within an interior side surface of the silicon interconnects 106, as illustrated in FIGS. 17A-17B. In this manner, partially forming conductive layer 123 over the top surface of the silicon interconnect 106 can provide greater surface area for ohmic contact with the silicon interconnects 106. Due to the closer proximity of the silicon interconnect 106 to the top surface of the SOI structure than the backside surface of the SOI structure, in accordance with some embodiments, it may be more efficient to form a layer of conductive layer 123 within the interior side surface of silicon interconnect 106 from above the top surface of the SOI structure as opposed to from the back surface of the SOI structure. In an embodiment, the patterned conductive layer 123 is formed by sputtering through a shadow mask. In an embodiment, the patterned conductive layer 123 includes a first layer of 500 angstrom thick titanium (Ti), a middle layer of 500 angstrom thick titanium-tungsten (TiW), and a 1 μm to 2 μm thick outer layer of gold (Au). In an embodiment, the patterned conductive layer 123 makes ohmic contact with the silicon interconnects 106.

Referring now to FIGS. 18A-18B, a patterned conductive layer 122 may be formed on the passivation layer 133 within the via openings 120A and in electrical contact with the patterned conductive layer 123. Conductive layer 122 may be formed from the same or different material from conductive layer 123, and may have the same or different thicknesses. In an embodiment, conductive layer 123 has a thicker layer of gold. Following the formation of patterned conductive layers 122, 123, the SOI substrate may then be diced, for example using laser dicing, to form a plurality of transfer heads each including an array of transfer heads 102, interconnected with silicon interconnects 104, 106 and vias 120 extending through the base substrate 130 from a backside of the base substrate to the patterned silicon layer 140, and through the patterned silicon layer 140, to electrically connect the silicon electrodes 110 with working circuitry of a transfer head assembly.

FIGS. 19A-28B illustrate a method of forming a bipolar micro device transfer head including backside via openings with tapered sidewalls in accordance with an embodiment of the invention. The processing sequence leading up to FIGS. 19A-19B may be identical to the processing sequence of FIGS. 6A-8B. In an embodiment illustrated in FIGS. 19A-19B, a patterned hardmask layer 150 is formed over the backside passivation layer 132 for patterning of the backside passivation layer. Hardmask layer 150 may be deposited with any suitable method such as chemical vapor deposition (CVD) or plasma enhanced chemical vapor deposition (PECVD). In an embodiment, a 2 μm thick PECVD silicon nitride hardmask layer 150 is deposited, followed by deposition of a thick patterned positive photoresist. The hardmask layer 150 and backside passivation layer 132 are then etched using RIE to form openings stopping on the base substrate 130. The patterned photoresist is then removed by $O_2$ ashing followed by piranha etch and short HF dip resulting in the structure in FIGS. 19A-19B.

Referring now to FIGS. 20A-20B, backside via openings 120A are then etched into the base substrate 130. In an embodiment, single-sided wet etching is performed using a suitable etching solution such as KOH to form backside via openings 120A with tapered sidewalls in the base substrate 130 and stopping on the buried oxide layer 124. As illustrated, the via openings 120A at the bottom surface of the base substrate 130 are wider or have a larger cross-section than at a top surface of the base substrate 130 at the interface with the buried oxide layer 124. Where the base substrate 130 is (100) silicon, the KOH wet etchant may attack the silicon preferentially in the (100) plane to produce the illustrated V-etch structure. The patterned hard mask layer 150 may then be removed using a blanket nitride etching solution, as illustrated in FIGS. 21A-21B.

The following process sequence of FIGS. 22A-24B may be identical to that described above with regard to FIGS. 10A-12B, and the following process sequence of FIGS. 25A-28B may be identical to that described above with regard to FIGS. 15A-18B. It is to be appreciated that while the processing sequence for forming the final structure illustrated in FIGS. 28A-28B includes tapered sidewalls in backside via opening 120A as well as a topside via opening 120B, that a topside via opening 120B is not required for the formation of tapered sidewalls in backside via opening 120A.

FIGS. 29A-32B illustrate a method of forming a bipolar micro device transfer head including a replacement electrode dielectric in accordance with an embodiment of the invention. The processing sequence leading up to FIGS. 29A-29B may be identical to the processing sequence of FIGS. 6A-8B and FIGS. 19A-24B. Referring now to FIGS. 29A-29B, in an embodiment openings are formed in the top dielectric layer 118 directly above the backside via openings 120A and directly over the mesa structures 112. In the particular embodiment illustrated, the dielectric layer 118 is not completely removed from between the adjacent mesa structures 112 in a bipolar electrode transfer head 102. Openings may be formed in top dielectric layer 118 with a thick patterned positive photoresist, followed by dry etching of the top dielectric layer 118. The patterned photoresist is then removed by $O_2$ ashing followed by piranha etch. Openings are then formed in the silicon layer 140 and buried oxide layer 124 to form a topside via opening 120B which connects with backside via opening 120A. Openings may be formed in the silicon layer 140 and buried oxide layer 124 by forming a thick patterned positive photoresist, followed by DRIE of the silicon layer 140 stopping on the buried oxide layer 124, followed by RIE through the buried oxide layer 124. The patterned photoresist is then removed by $O_2$ ashing followed by piranha etch resulting in the structure in FIGS. 29A-29B.

A patterned conductive layer 123 is then formed over the exposed top surface of the silicon interconnects 106 and within an interior side surface of the silicon interconnects 106, as illustrated in FIGS. 30A-30B. In this manner, partially forming conductive layer 123 over the top surface of the silicon interconnect 106 can provide greater surface area for ohmic contact with the silicon interconnects 106. Due to the closer proximity of the silicon interconnect 106 to the top surface of the SOI structure than the backside surface of the SOI structure, in accordance with some embodiments, it may be more efficient to form a layer of conductive layer 123 within the interior side surface of silicon interconnect 106 from above the top surface of the SOI structure as opposed to from the back surface of the SOI structure. In an embodiment, the patterned conductive layer 123 is formed by sputtering through a shadow mask. In an embodiment, the patterned conductive layer 123 includes a first layer of 500 angstrom thick titanium (Ti), a middle layer of 500 angstrom thick titanium-tungsten (TiW), and a 1 μm to 2 μm thick outer layer of gold (Au). In an embodiment, the patterned conductive layer 123 makes ohmic contact with the silicon interconnects 106.

A patterned conductive layer 122 may be formed on the passivation layer 133 within the via openings 120A and in electrical contact with the patterned conductive layer 123 as illustrated in FIGS. 31A-31B. Conductive layer 122 may be formed from the same or different material from conductive layer 123, and may have the same or different thicknesses. In an embodiment, conductive layer 123 has a thicker layer of gold. Conductive layers 122, 123 may form a continuous conductive layer along the via 120 side surfaces.

Referring now to FIGS. 32A-32B, a second dielectric layer may be blanket deposited over the top surface of the patterned SOI stack, while providing backside protection. As illustrated the second dielectric layer 126 is formed on the mesa structures 112, on dielectric layer 118 and in the vias 120. In an embodiment, the second dielectric layer 126 is formed within the via opening 120 adjacent the patterned silicon layer 140. In an embodiment, the second dielectric layer may have a higher dielectric constant or dielectric breakdown strength than dielectric layer 118, and has a thickness between 0.5 μm-10 μm. For example, the second dielectric layer 126 a layer of $Al_2O_3$, $Ta_2O_5$, or $HfO_2$ deposited by atomic layer deposition (ALD). Following the formation of dielectric layer 126, the SOI substrate may then be diced, for example using laser dicing, to form a plurality of transfer heads.

Figure 33:
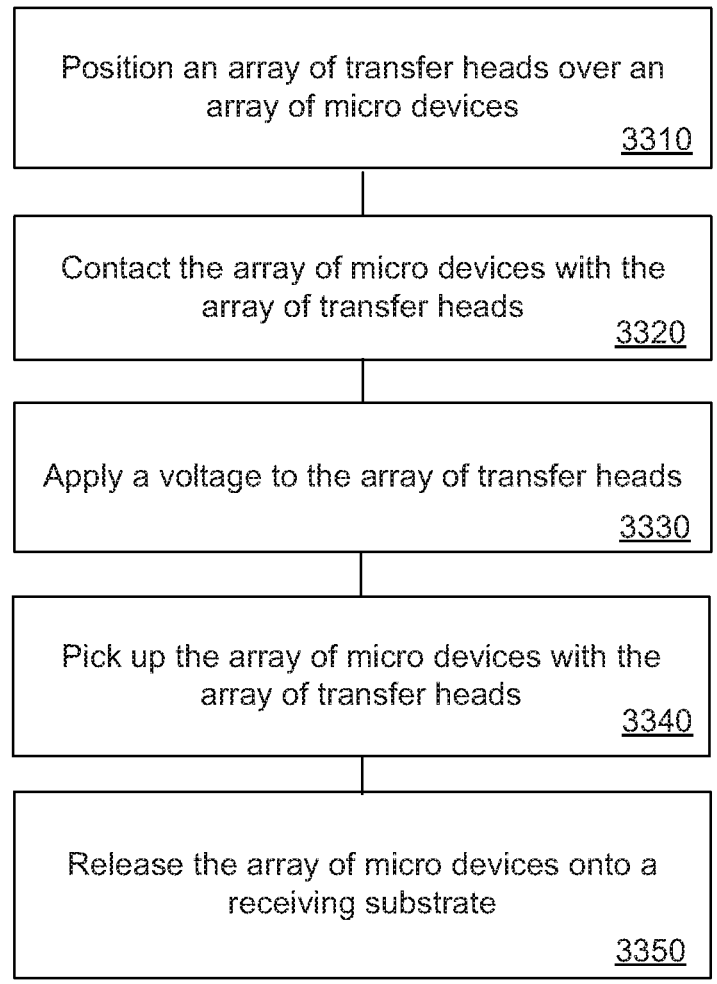
FIG. 33 is a flow chart illustrating a method of picking up and transferring an array of micro devices from a carrier substrate to a receiving substrate in accordance with an embodiment of the invention.
Figure 34:
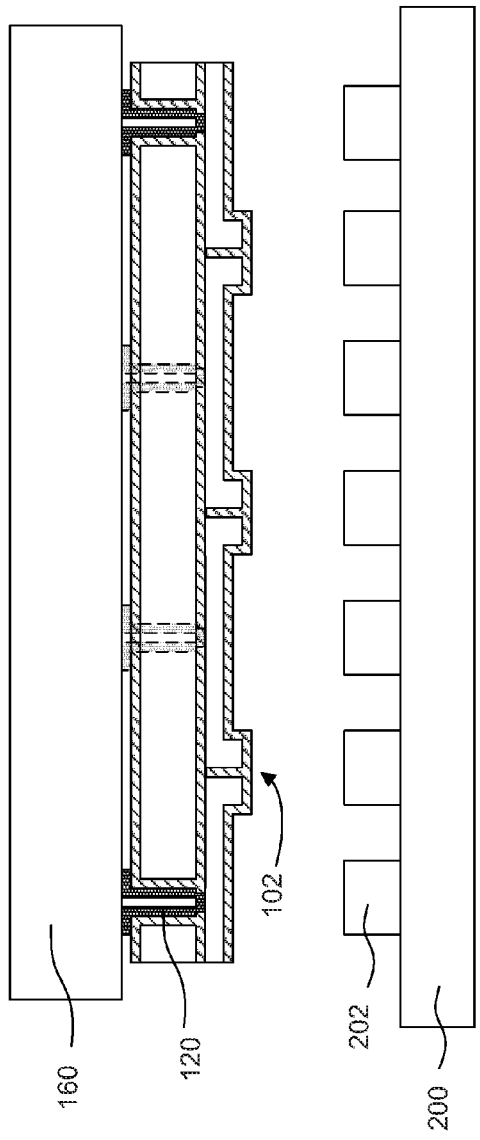
FIG. 34 is a cross-sectional side view illustration of an array of micro device transfer heads positioned over an array of micro devices on a carrier substrate in accordance with an embodiment of the invention.
Figure 35:
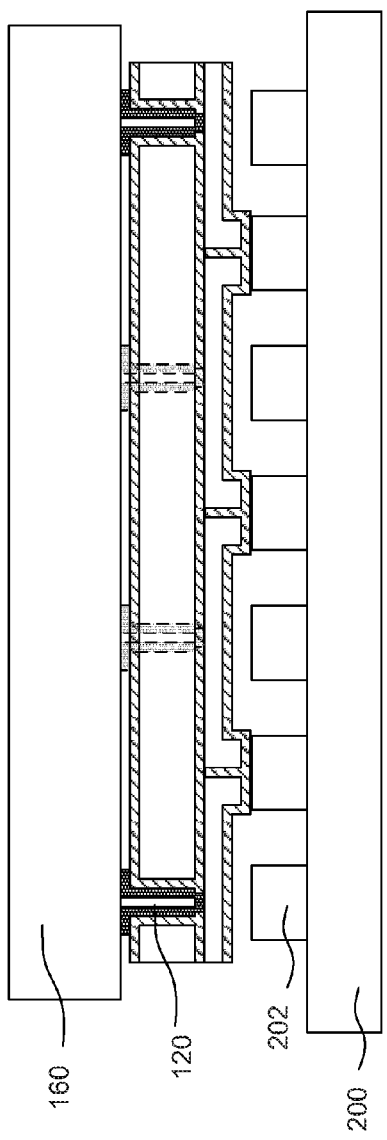
FIG. 35 is a cross-sectional side view illustration of an array of micro device transfer heads in contact with an array of micro devices in accordance with an embodiment of the invention.

In accordance with embodiments of the invention, the dielectric layer 118 or 126 covering the mesa structures 112 has a suitable thickness and dielectric constant for achieving the required grip pressure for the micro device transfer head, and sufficient dielectric strength to not break down at the operating voltage. FIG. 33 is a flow chart illustrating a method of picking up and transferring an array of micro devices from a carrier substrate to a receiving substrate in accordance with an embodiment of the invention. At operation 3310 an array of transfer heads is positioned over an array of micro devices on a carrier substrate. FIG. 34 is a cross-sectional side view illustration of an array of micro device transfer heads 102 positioned over an array of micro devices on a carrier substrate 200 in accordance with an embodiment of the invention. At operation 3320 the array of micro devices are contacted with the array of transfer heads. In an alternative embodiment, the array of transfer heads is positioned over the array of micro devices with a suitable air gap separating them which does not significantly affect the grip pressure, for example, 1 nm to 10 nm. FIG. 35 is a cross-sectional side view illustration of an array of micro device transfer heads 102 in contact with an array of micro devices 202 in accordance with an embodiment of the invention. As illustrated, the pitch of the array of transfer heads 202 is an integer multiple of the pitch of the array of micro devices 202. At operation 3330 a voltage is applied to the array of transfer heads 102. The voltage may be applied from the working circuitry within a transfer head assembly 160 in electrical connection with the array of transfer heads through vias 120. At operation 3340 the array of micro devices is picked up with the array of transfer heads. FIG. 36 is a cross-sectional side view illustration of an array of transfer heads 102 picking up an array of micro devices 202 in accordance with an embodiment of the invention. At operation 3350 the array of micro devices is then released onto a receiving substrate. For example, the receiving substrate may be, but is not limited to, a display substrate, a lighting substrate, a substrate with functional devices such as transistors or ICs, or a substrate with metal redistribution lines. FIG. 37 is a cross-sectional side view illustration of an array of micro devices 202 released onto a receiving substrate 300 in accordance with an embodiment of the invention.

While operations 3310-3350 have been illustrated sequentially in FIG. 33, it is to be appreciated that embodiments are not so limited and that additional operations may be performed and certain operations may be performed in a different sequence. For example, in one embodiment, an operation is performed to create a phase change in a bonding layer connecting the micro device to the carrier substrate prior to or while picking up the micro device. For example, the bonding layer may have a liquidus temperature less than 350° C., or more specifically less than 200° C. The bonding layer may be formed of a material which provides adhesion to the carrier substrate, yet also a medium from which the micro device is readily releasable. In an embodiment, the bonding layer is a material such as indium or an indium alloy. If a portion of the bonding layer is picked up with the micro device, additional operations can be performed to control the phase of the portion of the bonding layer during subsequent processing. For example, heat can be applied to the bonding layer from a heat source located within the transfer head assembly 160, carrier substrate 200, and/or receiving substrate 300.

Furthermore, operation 3330 of applying the voltage to create a grip pressure on the micro devices can be performed in various orders. For example, the voltage can be applied prior to contacting the array of micro devices with the array of transfer heads, while contacting the micro devices with the array of transfer heads, or after contacting the micro devices with the array of transfer heads. The voltage may also be applied prior to, while, or after creating a phase change in the bonding layer.

Where the transfer heads 102 include bipolar silicon electrodes, an alternative voltage is applied across a the pair of silicon electrodes in each transfer head 102 so that at a particular point in the when a negative voltage is applied to one silicon electrode, a positive voltage is applied to the other silicon electrode in the pair, and vice versa to create the pickup pressure. Releasing the micro devices from the transfer heads 102 may be accomplished with a varied of methods including turning off the voltage sources, lower the voltage across the pair of silicon electrodes, changing a waveform of the AC voltage, and grounding the voltage sources.

In accordance with embodiments of the invention, manners of forming an array of transfer heads and manners for operating an array of transfer heads to transfer an array of micro devices have been described. Embodiments of the invention may be utilized to transfer a variety of micro devices such as, but not limited to, diodes, LEDs, transistors, ICs, and MEMS. In an embodiment, the array of transfer heads may be utilized to transfer an array of micro LED devices which are poised for pick up, such as the structures described in U.S. patent application Ser. No. 13/372,222 and U.S. patent application Ser. No. 13/458,932, both of which are incorporated herein by reference.

In utilizing the various aspects of this invention, it would become apparent to one skilled in the art that combinations or variations of the above embodiments are possible for forming a micro device transfer head and head array, and for transferring a micro device and micro device array. Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:

1. A bipolar micro device transfer head array comprising:
a base substrate;
an array of electrostatic transfer heads, each electrostatic transfer head including a pair of silicon electrodes, and a dielectric material covering a top surface of the pair of silicon electrodes;
wherein each silicon electrode is doped.

2. The micro device transfer head array of claim 1, wherein the dielectric material covers the top surface of each pair of silicon electrodes for each electrostatic transfer head in the array of electrostatic transfer heads.

3. The micro device transfer head array of claim 1, wherein the array of electrostatic transfer heads comprises:
a first array of silicon electrodes in electrical connection with a first bus interconnect; and
a second array of silicon electrodes in electrical connection with a second bus interconnect.

4. The micro device transfer head array of claim 3, wherein the array of electrostatic transfer heads comprises:
a first plurality of trace interconnects electrically connecting the first array of silicon electrodes with the first bus interconnect; and
a second plurality of trace interconnects electrically connecting the second array of silicon electrodes with the second bus interconnect.

5. The micro device transfer head array of claim 4, wherein the first and second plurality of trace interconnects are silicon trace interconnects, and the first and second bus interconnects are silicon bus interconnects.

6. The micro device transfer head array of claim 4, wherein the first plurality of trace interconnects run parallel with the second plurality of trace interconnects.

7. The micro device transfer head array of claim 6, wherein the first array of silicon electrodes extend from the first plurality of trace interconnects and the second array of silicon electrodes extend form the second plurality of trace interconnects parallel with the first array of silicon electrodes.

8. The micro device transfer head array of claim 7, further comprising an array of dielectric joints between the first array of silicon electrodes and the second array of silicon electrodes.

9. The micro device transfer head array of claim 3, further comprising a first voltage source connection in electrical connection with the first bus interconnect, and a second voltage source connection in electrical connection with the second bus interconnect.

10. The micro device transfer head array of claim 9, wherein the first voltage source connection comprises a via extending through the base substrate, and the second voltage source connection comprises a via extending through the base substrate.

11. The micro device transfer head array of claim 1, wherein each electrostatic transfer head is configured to pick up an individual micro device of 1 to 100 μm scale.

12. The micro device transfer head of claim 1, wherein the dielectric material covering the top surface of the pair of silicon electrodes has a thickness between 0.5-10 μm.

13. The micro device transfer head of claim 1, wherein each silicon electrode includes a silicon electrode lead and a silicon mesa structure.

14. The micro device transfer head of claim 13, wherein the mesa structure is less than 20 μm thick.

15. The micro device transfer head of claim 13, wherein the mesa structure is less than 10 μm thick.

16. The micro device transfer head of claim 1, further comprising an oxide layer on a bottom surface of the pair of silicon electrodes.

17. The micro device transfer head of claim 1, wherein the dielectric material comprises an oxide selected from the group consisting of $SiO_2$, $Al_2O_3$, $Ta_2O_5$, $HfO_2$, and $RuO_2$.

18. The micro device transfer head of claim 1, wherein each silicon electrode is doped with an n-dopant.

19. The micro device transfer head of claim 1, wherein each silicon electrode is doped with phosphorus.

20. The micro device transfer head of claim 1, wherein each silicon electrode is formed in a doped silicon device layer with a resistivity of less than 0.1 ohm-centimeter.

* * * * *